United States Patent
Ueda

(10) Patent No.: US 8,513,809 B2
(45) Date of Patent: Aug. 20, 2013

(54) SEMICONDUCTOR DEVICE

(75) Inventor: Yasuhiko Ueda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 110 days.

(21) Appl. No.: 13/102,521

(22) Filed: May 6, 2011

(65) Prior Publication Data
US 2011/0278654 A1 Nov. 17, 2011

(30) Foreign Application Priority Data
May 12, 2010 (JP) .................................. 2010-110099

(51) Int. Cl.
*H01L 23/52* (2006.01)
(52) U.S. Cl.
USPC ........... 257/758; 257/773; 257/774; 438/637; 438/666; 438/778; 438/787; 438/788
(58) Field of Classification Search
None
See application file for complete search history.

(56) References Cited

U.S. PATENT DOCUMENTS
2009/0072409 A1* 3/2009 Nitta et al. .................... 257/774

FOREIGN PATENT DOCUMENTS

| JP | 2004-193431 | 7/2004 |
|---|---|---|
| JP | 2006-165129 | 6/2006 |
| JP | 2006-228893 | 8/2006 |
| JP | 2006-269537 | 10/2006 |
| JP | 2008-159651 | 7/2008 |
| JP | 2009-130126 | 6/2009 |
| JP | 2009-147054 | 7/2009 |

* cited by examiner

*Primary Examiner* — Kyoung Lee
(74) *Attorney, Agent, or Firm* — Young & Thompson

(57) ABSTRACT

A semiconductor device includes an interlayer insulation film, a wiring embedded in the interlayer insulation film and an air gap part formed between a side surface of the wiring and the interlayer insulation film. A first sidewall film is formed in the air gap part so that the first sidewall film contacts with the side surface of the wiring.

21 Claims, 37 Drawing Sheets

SEMICONDUCTOR DEVICE

This application is based upon and claims the benefit of priority from Japanese Patent Application No. 2010-110099, filed on May 12, 2010, the disclosure of which is incorporated herein in its entirety by reference.

TECHNICAL FIELD

The present invention relates to a semiconductor device.

BACKGROUND ART

As the semiconductor devices have been recently miniaturized, wirings configuring a circuit have been also miniaturized. In order to avoid delay of a circuit operation, which is caused due to the increase of a wiring resistance resulting from the miniaturization, JP-A Nos. 2004-193431 and 2006-165129 disclose methods of reducing parasitic capacitance of the wirings. In JP-A Nos. 2004-193431 and 2006-165129, a method is used which deposits an insulation film under condition that a step coverage is worsened, by using a narrow interval between the neighboring wirings. Since the step coverage is poor in case of using the method, the insulation film is connected at upper parts of the respective neighboring wirings, resulting in forming a void at a central part between the wirings. The void can be used as an air gap part between the wirings. Since the air gap part has a dielectric constant lower than that of the insulation film, it is possible to reduce the parasitic capacitance of the wirings.

SUMMARY OF THE INVENTION

In one embodiment, there is provided a semiconductor device, comprising:
an interlayer insulation film;
a wiring embedded in the interlayer insulation film; and
an air gap part formed between a side surface of the wiring and the interlayer insulation film.

In another embodiment, there is provided a semiconductor device, comprising:
an interlayer insulation film; and
a wiring having a side surface and embedded in the interlayer insulation film so that the side surface is opposed to the interlayer insulation film with an air gap part interposed between the wiring and the interlayer insulation film.

In another embodiment, there is provided a semiconductor device, comprising:
a plurality of wirings formed on a predetermined surface;
a plurality of recess parts, each of the recess parts having side surfaces of neighboring wirings and the predetermined surface positioned between the neighboring wirings;
an interlayer insulation film formed on the predetermined surface so as to cover the plurality of wirings; and
two air gap parts formed in each of the recess parts, between the interlayer insulation film and the side surfaces of the wirings opposed to the interlayer insulation film.

BRIEF DESCRIPTION OF THE DRAWINGS

The above features and advantages of the present invention will be more apparent from the following description of certain preferred embodiments taken in conjunction with the accompanying drawings, in which.

Figure 1:
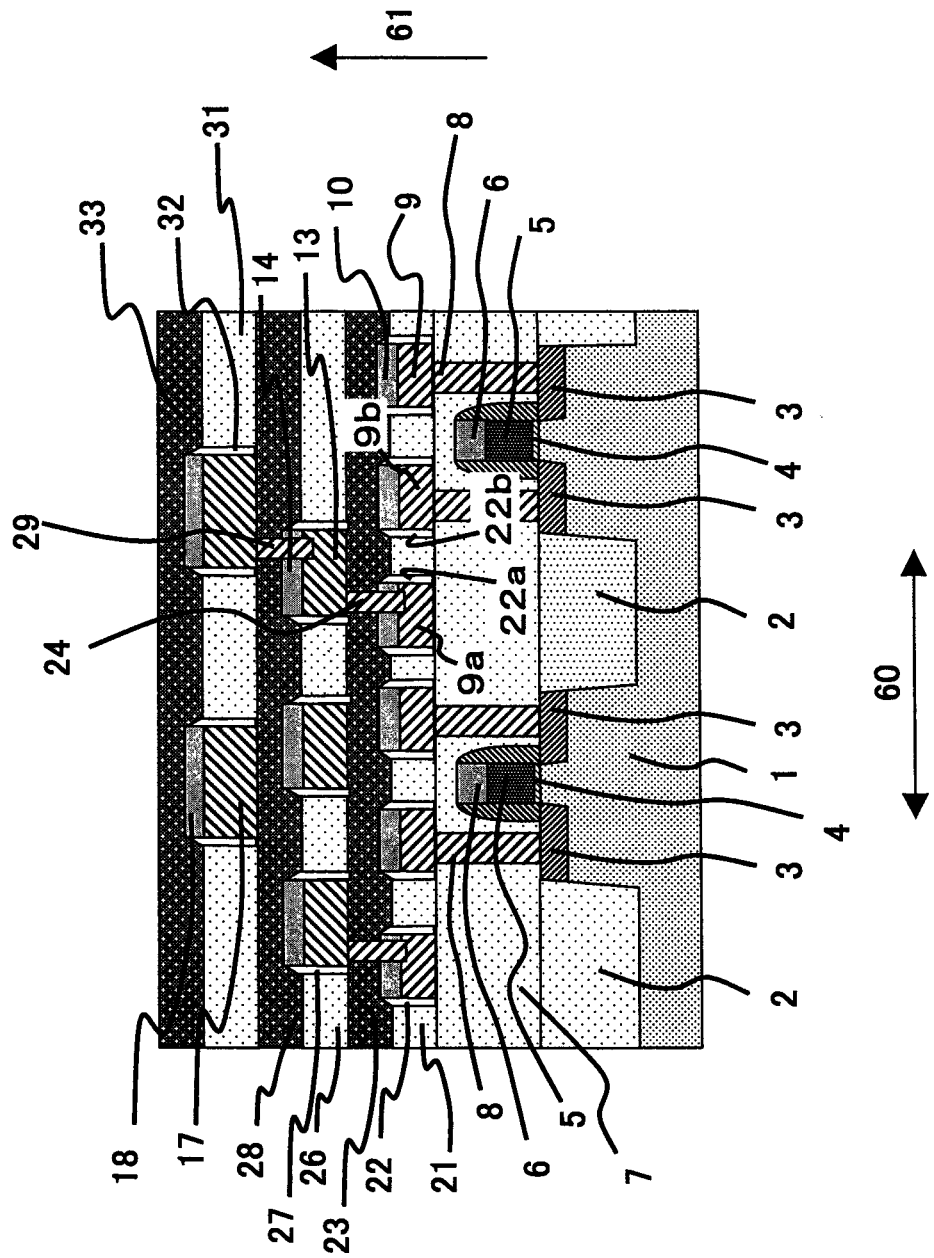
FIG. 1 illustrates a semiconductor device according to a first exemplary embodiment of the invention.

In the drawings, reference numerals have the following meanings: 1: semiconductor substrate, 2: isolation region, 3: diffusion region, 4: gate insulation film, 5: gate electrode, 6, 10, 14, 18, 27, 52: cap insulation film, 6': sidewall film, 7, 21, 23, 26, 28: interlayer insulation film, 8, 24, 29, 35, 35', 41, 50, 50': contact plug, 9, 9a, 9b: wiring, 10', 20, 25, 30: sidewall film, 13: second wiring, 17: third wiring, 20A, 25A, 30A: cover film, 22, 22a, 22b, 27, 32, 39, 54: air gap part, 23a, 23b: insulation film, 23c: void, 23d: step, 31, 33, 34, 38, 40, 44, 44', 49, 53, 55: interlayer insulation film, 36, 51: wiring, 42: capacitive contact, 45, 45': support film, 46: lower electrode, 47: capacitive film, 48: upper electrode, 60: normal direction to a side surface of a wiring, 61: first direction, 100: semiconductor device, 110: system bus, 120: data processor, 130: DRAM, 140: ROM, 150: memory device, 160: I/O apparatus, X1: interval between the first wirings, X2: interval between the first wirings, X3: interval between the third wirings

DESCRIPTION OF PREFERRED ILLUSTRATIVE EMBODIMENTS

A semiconductor device according to an exemplary embodiment of the invention has an air gap part between a side surface of a wiring and an interlayer insulation film. By the air gap part, it is possible to stably reduce parasitic capacitance between the wirings.

A semiconductor device according to another exemplary embodiment of the invention has a plurality of recess parts including a predetermined planar surface and side surfaces of neighboring wirings. An interlayer insulation film is embedded in the respective recess parts. In each of the recess parts, two air gap parts are provided between the interlayer insulation film and side surfaces of wirings opposed to the interlayer insulation film. Like this, the two air gap parts are provided for each of the recess parts, so that it is possible to reduce the parasitic capacitance between the wirings more effectively.

In addition, according to a method of manufacturing the semiconductor device, it is possible to form an air gap part at a side surface of any wiring regardless of a wiring size and a pitch.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Exemplary Embodiment

In this exemplary embodiment, a logic apparatus include three wiring layers comprising air gap parts between interlayer insulation films. Referring to a sectional view of FIG. 1, the semiconductor device of this exemplary embodiment will be described.

As shown in FIG. 1, isolation region 2 and diffusion regions 3 are provided in a semiconductor substrate 1. Transistors each of which includes a gate insulation film 4, a gate electrode 5 and a cap insulation film 6 are formed on the semiconductor substrate 1 and are embedded in an interlayer insulation film 7.

First wirings 9 and a cap insulation films 10 are provided on the interlayer insulation film 7. The first wirings 9 and the cap insulation films 10 are embedded in interlayer insulation films 21, 23 with air gap parts 22 interposed between the first wirings 9 and the cap insulation films and the interlayer insulation films 21, 23. The interlayer insulation film 21 corresponds to a first insulation film and the interlayer insulation film 23 corresponds to a second insulation film. The first wirings 9 and the diffusion regions 3 are connected by contact plugs 8.

In addition, second wirings 13 and cap insulation films 14 are provided on the interlayer insulation film 23. The second wirings 13 and the cap insulation films 14 are embedded in interlayer insulation films 26, 28 with air gap parts 27 interposed between the second wirings 13 and the cap insulation films 14 and the interlayer insulation films 26, 28. The interlayer insulation film 26 corresponds to a first insulation film and the interlayer insulation film 28 corresponds to a second insulation film.

Third wirings 17 and cap insulation films 18 are provided on the interlayer insulation film 28. The third wirings 17 and the cap insulation films 18 are embedded in interlayer insulation films 31, 33 with air gap parts 32 interposed between the third wirings 17 and the cap insulation films 18 and the interlayer insulation films 31, 33. The interlayer insulation film 31 corresponds to a first insulation film and the interlayer insulation film 33 corresponds to a second insulation film. As described above, when a plurality of wirings is provided at different heights, a plurality of first and second insulation films is respectively provided in some cases.

The semiconductor device of this exemplary embodiment forms a three-layered wiring structure including the first wirings 9, the second wirings 13 and the third wirings 17 disposed at different heights with each other, as described above. In the semiconductor device of this exemplary embodiment, the air gap parts 22, 27, 32 are provided to contact with side surfaces of the individual wirings of the first to three wirings. More specifically, the air gap parts 22, 27, 32 are respectively provided to contact with the left and right side surfaces of the first wiring 9, the second wiring 13 and the third wiring 17.

Referring to wirings 9a, 9b, which are the neighboring wirings, air gap parts 22a, 22b are respectively provided between the wirings so that they contact with the side surfaces of the wirings 9a, 9b. The interlayer insulation film 21 is arranged at a center sandwiched between the respective air gap parts 22a, 22b. Accordingly, an insulator that comprises the two air gap parts contacting with the respective wirings and one interlayer insulation film is formed between the neighboring wirings. As described above, a specific dielectric constant of the air gap part is about 1 and it is thus possible to remarkably reduce the dielectric constant, compared to the conventional solid insulation film. Compared to this configuration, the solid low-dielectric film, which is commercialized as a low-k film, has a specific dielectric constant of about 3.

In addition, each air gap part has one side surface, which contacts with the wiring and the cap insulation film positioned on an upper surface of the wiring and having a side surface at the same position as the side surface of the wiring. Each air gap part has the other side surface, which contacts with the opposing interlayer insulation film. An upper surface of the air gap part contacts with the interlayer insulation film that is positioned above the wiring and a lower surface thereof contacts with the interlayer insulation film that is the same position as a lower layer of the wiring.

For example, referring to the air gap part 22b, one side surface (right side surface in FIG. 1) contacts with the side surfaces of the wiring 9b and the cap insulation film 10 and the other side surface (left side surface in FIG. 1) contacts with the side surface of the interlayer insulation film 21 positioned between the wirings. An upper surface of the cap insulation film 10 contacts with the interlayer insulation film 23 that is positioned above the wiring and a lower surface thereof contacts with the wiring 9.

Seeing the configuration from a different angle, the air gap part 22b is configured so that it is surrounded by each of the wiring 9b, the cap insulation film 10, the interlayer insulation film 21 positioned between the wirings, the interlayer insulation film 23 positioned above the wiring 9 and the interlayer insulation film 7 positioned under the wiring 9. Regarding the air gap part, a width in a normal direction of the side surface of the wiring is constant except for an upper inclined surface thereof and the air gap part contacts with at least the entire side surface of the wiring. The width of the air gap part in the normal direction to the side surface of the wiring is preferably about 2 to 200 nm. Thereby, it is possible to form an air gap part having a stable shape and thus to effectively reduce the parasitic capacitance of the wirings.

In a first direction 61 from the first insulation film toward the second insulation film in FIG. 1, a position of the upper surface of the interlayer insulation film 21 positioned between the wirings and contacting with the air gap parts is lower than a position of the upper surfaces of the cap insulation films 10 positioned on the upper surfaces of the first wirings 9. In addition, the upper surface of the interlayer insulation film 21 is preferably higher than the upper surfaces of the first wirings 9. In this case, the positions of the upper surfaces of the first wirings 9, the upper surface of the interlayer insulation film 21, the upper surfaces of the cap insulation films 10 and the upper surface of the interlayer insulation film 23 in the first direction 61 are higher in order of the upper surfaces of the first wirings 9, the upper surface of the interlayer insulation film 21, the upper surfaces of the cap insulation films 10 and the upper surface of the interlayer insulation film 23.

In this exemplary embodiment, the same configuration is made for any wiring of the three wiring layers. In addition, the invention is not limited to the three layers. For example, the same configuration can be applied to a structure including more wiring layers.

According to the semiconductor device of this exemplary embodiment, it is possible to independently provide the air gap parts to the individual wirings without being influenced by a physical shape formed by the neighboring wirings. Accordingly, it is not necessary to consider a wiring layout for providing an air gap part. As a result, it is possible to increase a degree of freedom of the wiring layout while reducing the parasitic resistance of the wirings.

The wiring layout of the semiconductor device has various sizes and pitches depending on the specifications of the device. Especially, in the multi-layered wiring structure, the layout is highly different in each layer. According to the prior art, it was possible to provide an air gap part, which reduces the parasitic capacitance between the wirings, for only a specific layout wiring.

However, according to this exemplary embodiment, it is possible to provide the air gap parts contacting with the side-walls of the wirings for a wiring structure of any layout. As a result, it is possible to securely reduce the parasitic capacitance.

Figure 6:
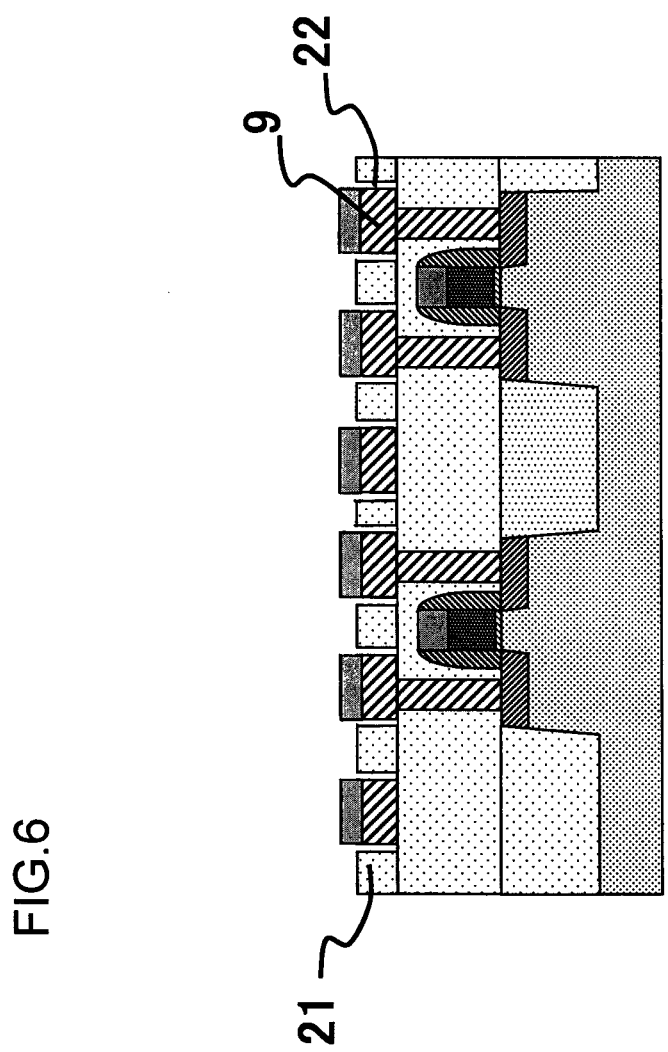
Figure 7:
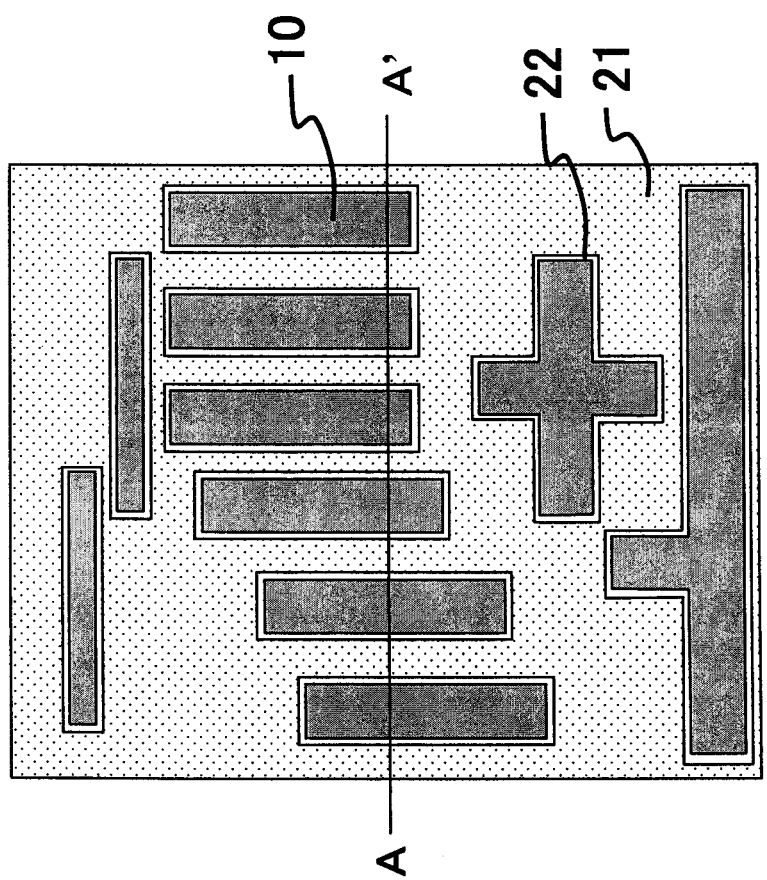
Figure 15:
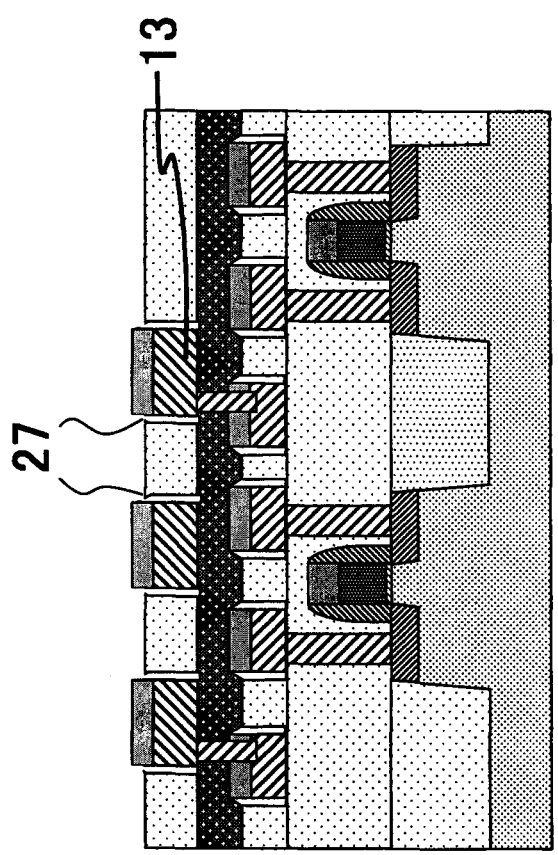
Figure 16:
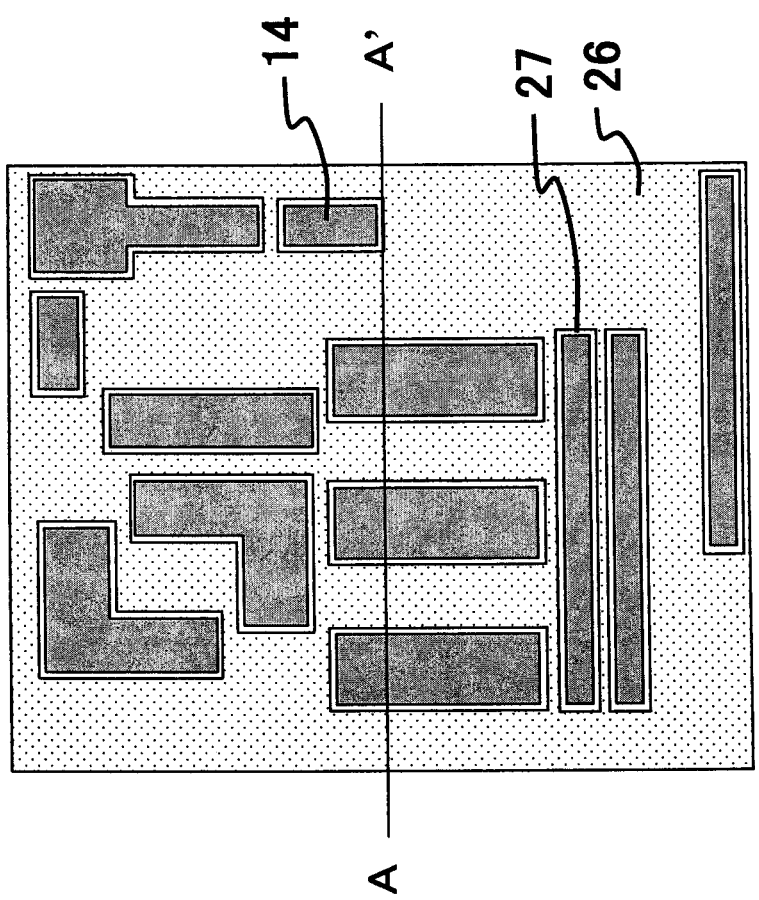
Figure 23:
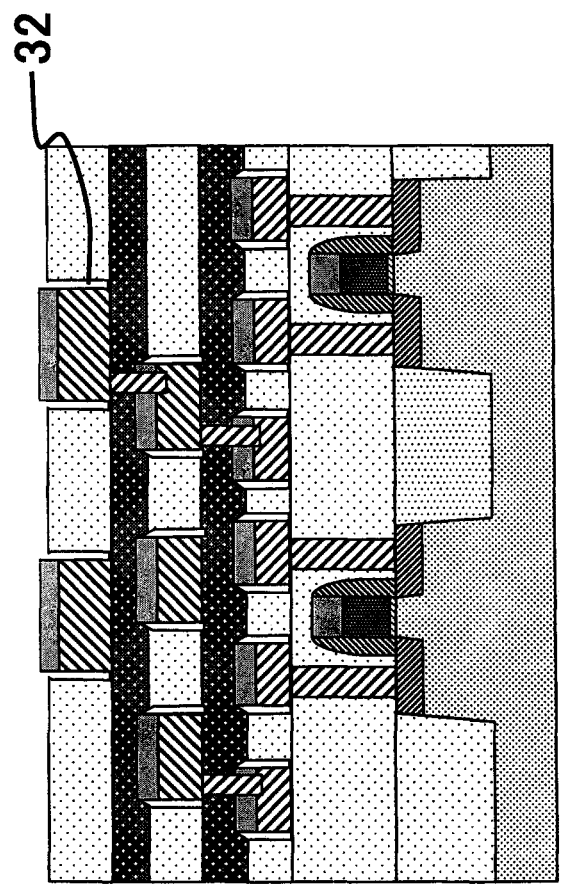
Figure 24:
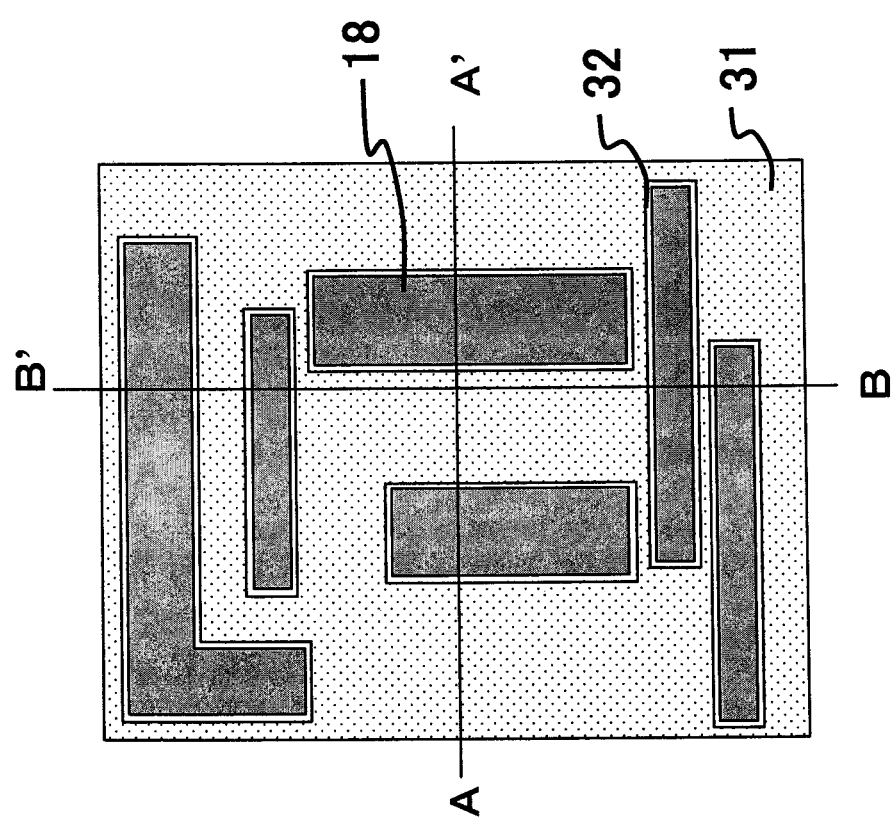

Next, a method of manufacturing the semiconductor device of this exemplary embodiment will be described with reference to FIGS. 2 to 26. FIG. 7 is a plan view after forming first wirings, which corresponds to a sectional view of FIG. 6, and FIG. 6 is a sectional view taken along a line A-A' of FIG. 7. FIG. 16 is a plan view after forming second wirings, which corresponds to a sectional view of FIG. 15, and FIG. 15 is a sectional view taken along a line A-A' of FIG. 16. Likewise, FIG. 24 is a plan view after forming third wirings, which corresponds to a sectional view of FIG. 23, and FIG. 23 is a sectional view taken along a line A-A' of FIG. 24. FIGS. 1 to 6, FIGS. 8 to 15, FIGS. 17 to 23 and FIG. 25 are sectional views (including partial enlarged views) taken along a line A-A' common to the respective plan views and FIG. 26 is a sectional view taken along a line B-B' of FIG. 24 after forming the wirings of the third layer.

Figure 2:
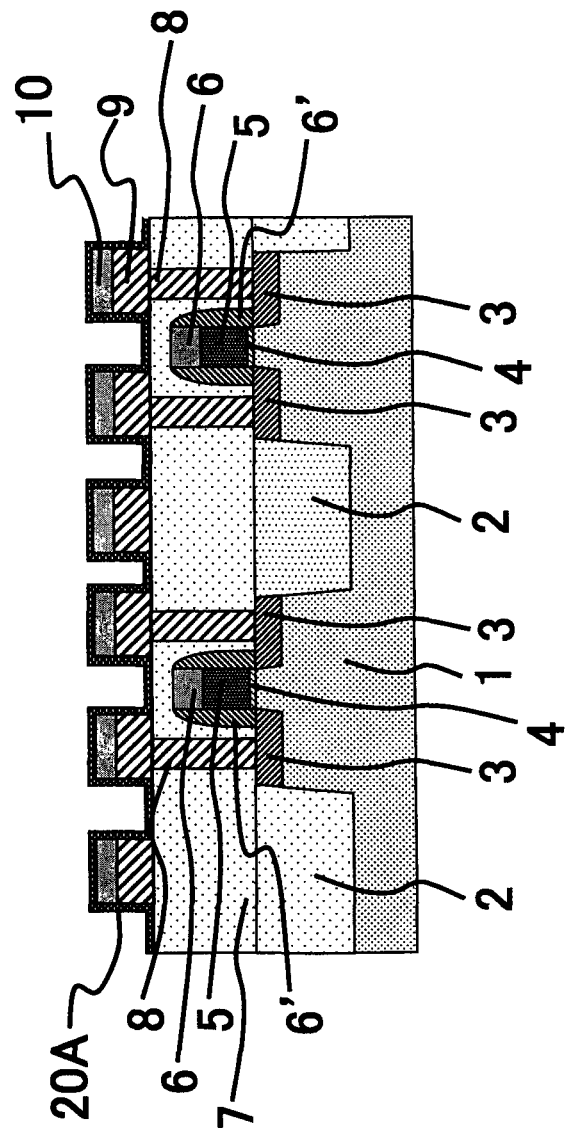
FIGS. 2 to 26 illustrate a method of manufacturing the semiconductor device according to the first exemplary embodiment of the invention.

First, as shown in FIG. 2, the isolation region 2, which are made of an insulation film such as silicon oxide ($SiO_2$) and the like, and the diffusion regions 3, which are formed by an ion implantation method of phosphorous (P) and the like, are formed in the semiconductor substrate 1. The gate insulation films 4 by a thermal oxidation method, the gate electrodes 5, which is a conductive film of poly silicon, tungsten (W) and the like, and the cap insulation films 6 made of silicon nitride (SiN) and the like are formed. Then, patterns of transistors are formed by dry etching.

Further, an insulation film made of silicon nitride (SiN) and the like is formed and etched back. Thereby, sidewall films 6' cover the side surfaces of the transistor patterns, resulting in completing transistors surrounded by the cap insulation films 6 and the sidewall films 6'.

Then, the interlayer insulation film 7 made of SOD (Spin On Dielectrics) and the like is formed in order to embed the transistors and a surface thereof is planarized by CMP (Chemical Mechanical Polishing). A photoresist film (not shown) applied on the interlayer insulation film 7 is exposed and developed, to form an opening (hole) pattern having a desired shape above the desired diffusion regions 3 and first openings (not shown) are formed in the interlayer insulation film 7 by the dry etching. A conductive film made of tungsten (W) and the like is used in order to embed the insides of the first openings and then the CMP process is performed to remove the conductive film on the interlayer insulation film 7, resulting in forming the contact plugs 8. Here, the contact plugs 8 are connected to the diffusion regions 3.

Subsequently, a tungsten (W) film having a thickness of about 50 nm by a sputtering method and the cap insulation film 10 made of silicon nitride (SiN) having a thickness of about 100 nm by a PE-CVD (Plasma Enhance-CVD) method are sequentially formed on an entire surface on the interlayer insulation film 7. Then, the films are separated (patterned) by the photolithography and dry etching method, to form the first wirings 9 having the cap insulation film 10 on the upper surfaces thereof. Since the anisotropic dry etching is used as the dry etching, the side surfaces of the cap insulation films 10 and the side surfaces of the first wirings 9 configure the same plane. The first wiring 9 is not limited to tungsten. For example, a metal film wiring made of copper, aluminum and the like, a poly-metal wiring having a metal film deposited on silicon and a polycide wiring having a metal silicide film deposited on silicon may be used.

Further, a cover film 20A made of carbon (C) is formed on the entire surface so that the wirings are not embedded therebetween. The cover film 20A is formed by an LP-CVD method under the below conditions using only a thermal reaction so as to obtain a favorable step coverage. Typically, the CVD method using a plasma reaction is used to form the carbon film. In this case, however, a step coverage is poor. As a result, a void is caused in an interlayer insulation film that is subsequently formed so as to embed between the wirings. Thus, the CVD method is not preferable.

Figure 3:
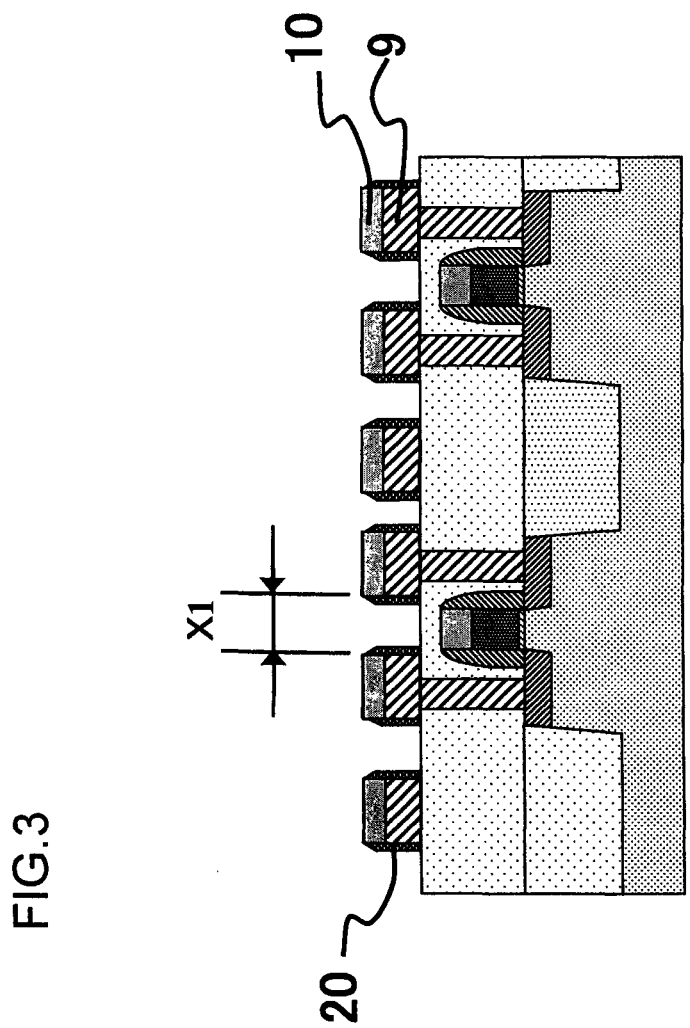

(1) Process Conditions for Forming Carbon Film
Method: LP-CVD method
Pressure: 120 Torr
Temperature: 550° C.
Process gas (flow rate): ethylene ($C_2H_4$) (1000 sccm)/propylene ($C_3H_8$) (2000 sccm)
Film thickness: 15 nm Then, as shown in FIG. 3, when the cover film 20A is etched back by the anisotropic dry etching, the cover films 20A remain on the side surfaces of the first wirings 9 and the cap insulation films 10, to form second sidewall films 20 made of the carbon film. Since the second sidewall films 20 are formed by the etch back, it is possible to form the second sidewall films on the side surfaces of all wirings. Here, an interval X1 between the first wirings 9 is about 50 nm. As described above, since the cover film 20A is formed in order to have a thickness of about 15 nm, the remaining interval between the first wirings 9 is about 20 nm. In addition, since the first wirings 9 have a thickness of about 50 nm and the cap insulation films 10 have a thickness of about 100 nm, a recess part formed between the wirings has an aspect ratio of 150/20, i.e., a high aspect ratio of about 7.

Figure 4:
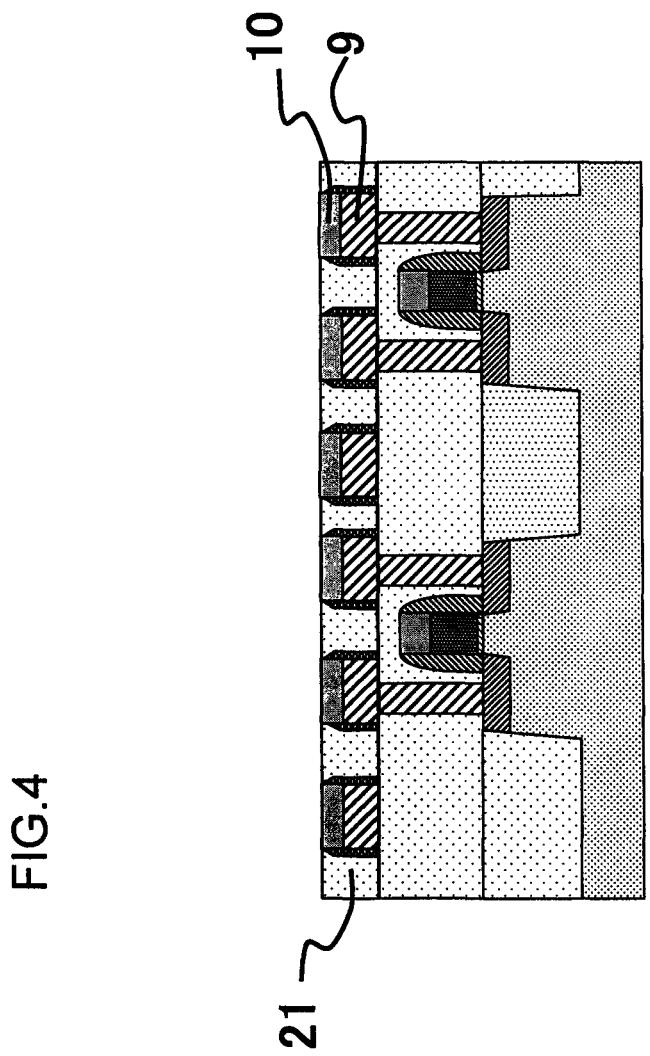

Then, as shown in FIG. 4, the interlayer insulation film 21 (which corresponds to a first insulation film) made of silicon oxide is formed by an ALD (Atomic Layer Deposition) method of following conditions, thereby embedding the first wirings 9. At this time, since the ALD method has the favorable embedding characteristic, it is possible to embed the wirings so that a void is not caused between the neighboring wirings, even when the recess part has the high aspect ratio as described above. For formation of the interlayer insulation film 21, a silicon oxide film that is formed by a rotating application method may be used in addition to the silicon oxide film by the ALD method.

(2) Process Conditions for Forming Silicon Oxide Film by ALD
Method: ALD method
Pressure: 7 Torr
Temperature: 200° C.
Process gas (flow rate): monosilane ($SiH_4$) (300 sccm)/oxygen (500 sccm)
Bias power: 500 W In the above conditions, organic silane such as tris[dimethylamino]silane (3DMAS) may be used instead of the monosilane that is a raw material of silicon. In addition, ozone may be used as oxidant, instead of oxygen.

Then, the interlayer insulation film 21, which is formed above the cap insulation films 10, is removed by the CMP in which the cap insulation films 10 is used as a stopper. Thereby, the recess parts formed between the wirings are embedded by the silicon oxide film.

Figure 5:
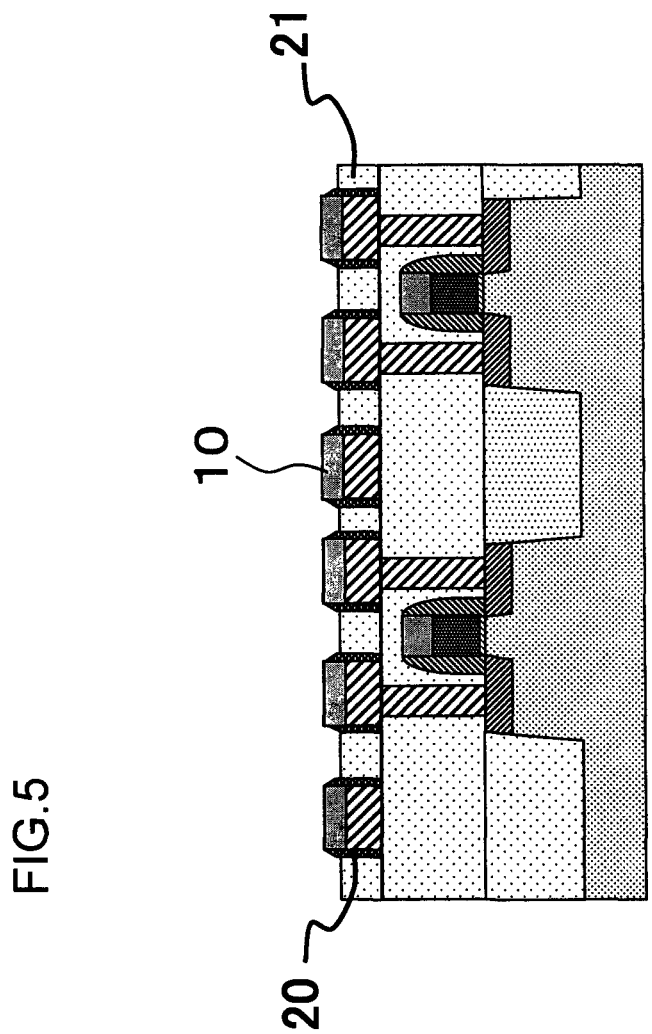

Then, as shown in FIG. 5, the interlayer insulation film 21 between the side surfaces of the cap insulation films 10 is removed by the etch back until upper end portions of the second sidewall films 20 are exposed. At this time, the etch back is preferably performed in such a way that the upper surface of the interlayer insulation film 21 after the etch back remains at a position higher than the upper surfaces of the first wirings 9. This is because, if the upper surface of the interlayer insulation film 21 after the etch back is lower than the upper surfaces of the first wirings 9, side spaces, which are formed on the side walls of the wirings in a subsequent process, are reduced and the effect of reducing the parasitic capacitance is lowered.

In order to make the upper surface of the interlayer insulation film 21 after the etch back be higher than the upper surfaces of the first wirings 9, it is preferable that the film thickness of the cap insulation films 10 formed on the upper surfaces of the first wirings 9 is not less than two times and not more than twenty times of the film thickness of the cover films 20A. After the etch back, the upper surfaces of the cover films 20A are inclined and a height of the inclined parts thereof is longer than twice of the film thickness of the cover film 20A. Accordingly, in order to expose all the inclined parts while keeping the state in which the upper surface of the interlayer insulation film 21 after the etch back is higher than the upper surfaces of the first wirings 9, it is preferable that the film thickness of the cap insulation films 10 is not less than two times of the film thickness of the cover films 20A. At this time, when the film thickness of the cap insulation films is thicker than twenty times of the film thickness of the cover films 20A, it becomes difficult to embed the cover films 20A in the recess parts in which the interlayer insulation film 21 is formed. Thus, it is preferable that the film thickness of the cap insulation films is not more than twenty times of the film thickness of the cover films 20A.

Then, as shown in FIG. 6, the second sidewall films 20 including the exposed upper ends are removed. Since the second sidewall films 20 are made of the carbon film, the films can be etching-removed by oxygen or hydrogen only. In this exemplary embodiment, under following conditions, the second sidewall films 20 are dry etching-removed by oxygen gas plasma.

(3) Process Conditions for Dry Etching
Method: parallel planar plasma etching
Pressure: 20 mTorr
Temperature: 20° C.
Process gas (flow rate): oxygen (500 sccm)
Bias power: 500 W At this time, since halogen gas plasma such as fluorine, chlorine and the like is not used, the silicon oxide film, the silicon nitride film, the silicon film, the metal film and the like are not etched. Accordingly, it is possible to remove only the second sidewall films 20 in a high selection ratio without damaging the shapes of the other structures. Thereby, it is possible to form side spaces 22 between the first wirings 9 and the interlayer insulation film 21 in high precision. In this exemplary embodiment, the side spaces 22 having a width of about 15 nm are formed between the first wirings 9 and the interlayer insulation film 21.

FIG. 7 is a plan view corresponding to the step shown in FIG. 6. As shown in the plan view of FIG. 7, the side spaces 22 are formed on the side surfaces of all the wirings 9 under the cap insulation film 10. In the plan view of FIG. 7, the wiring that is long in a lateral direction, the wiring that is long in a vertical direction, the wiring having a cross shape and the wiring having a reverse T shape are shown. The side spaces 22 are formed at the surroundings of all the wirings. In other words, it is possible to stably form the side spaces on the side surfaces of all the wirings without changing the forming situations of the side spaces 22 depending on the interval of the neighboring wirings 9, i.e., the wiring layouts.

Figure 8:
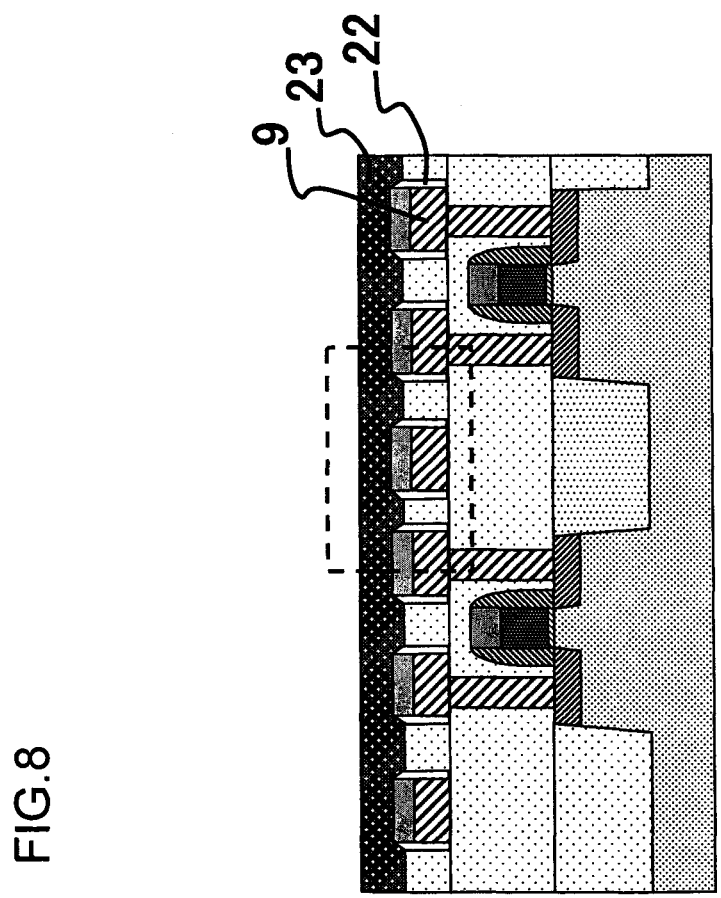

Then, as shown in FIG. 8, the interlayer insulation film 23 made of silicon oxide is formed by the PE-CVD (Plasma Enhanced-CVD) method having poor step coverage under the following conditions.

(4) Process Conditions for Forming Silicon Oxide Film
Method: PE-CVD
Pressure: 3 Torr
Temperature: 400° C.
Process gas (flow rate): monosilane ($SiH_4$) (250 sccm)/oxygen (2000 sccm)
Bias power: 450 W Thereby, it is possible to embed the first wirings 9 with the side spaces 22 being remained, to form the air gap parts 22 comprised of the side spaces. The reason is as follows: since the silicon oxide film is formed in the openings of the side spaces 22 so that the silicon oxide film has a visor shape, the gas for film formation cannot enter the inside of the side spaces 22.

Figure 9A:
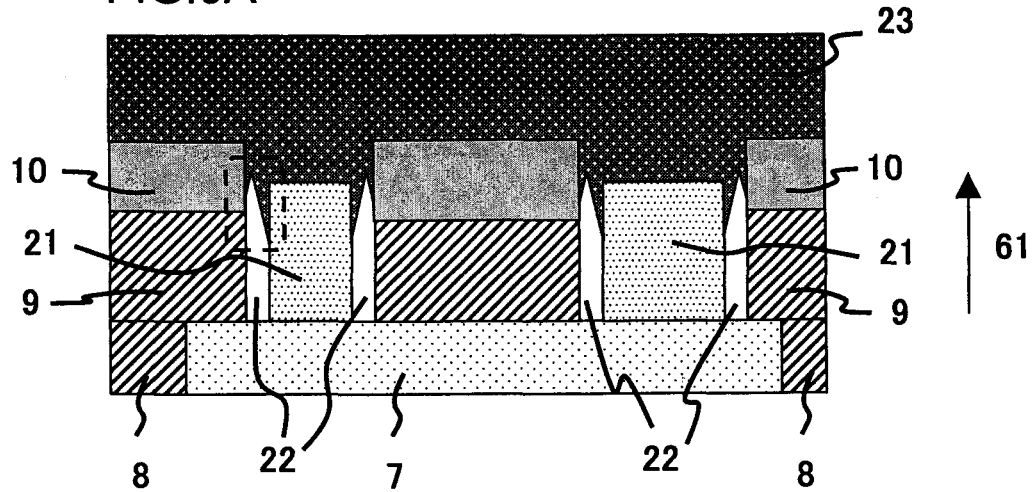

FIG. 9A is an enlarged view of a dotted part of FIG. 8 and shows that the air gap parts 22 are formed on the side surfaces of all the wirings. In addition, FIG. 9A shows that when the interlayer insulation film 23 having poor step coverage is formed, visor shapes are formed in upper ends (parts surrounded by a dotted line) of the air gap parts in the first direction 61 from the first insulation film toward the second insulation film. At the upper ends of the air gap parts, the interlayer insulation film 23 is formed so that the air gap parts 22 are tapered upwardly, and the air gap parts 22 is completely blocked adjacent to the upper surface of the interlayer insulation film 21. A film having poor step coverage has such a property that particles for film formation are apt to be adsorbed in a higher part of the film. Thus, the film formation is predominant at the higher part of the film and the particles for film formation cannot diffuse into the side space. As a result, a film is scarcely formed in the side space, so that it is possible to form a space that becomes an air gap part. At early stage of film formation, the particles for film formation diffuse a little into the side space, so that film formation is made. However, such film formation can be substantially disregarded because it does not change a shape of the side space.

Figure 9B:
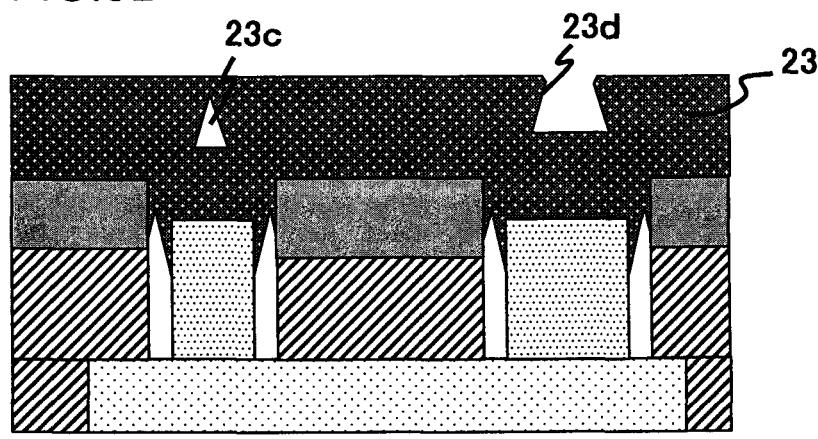

FIG. 9B is a sectional view showing a case where the interlayer insulation film 23 having poor step coverage is formed to be thick as a single layer film. The interlayer insulation film 23 is a film having poor step coverage. Accordingly, when the interlayer insulation film is formed to be thick, a void 23c or new step 23d is generated due to the step of the cap insulation film 10, resulting in a hindrance to a subsequent process. Accordingly, under the sectional shape as shown in FIG. 9B, the CMP process is performed to remove the void 23c or step 23d, thereby planarizing the surface thereof. A state resulting from the CMP process is shown in FIG. 9A. In addition, even when another insulation film is deposited after the planarizing, the state of FIG. 9A is obtained.

Figure 9C:
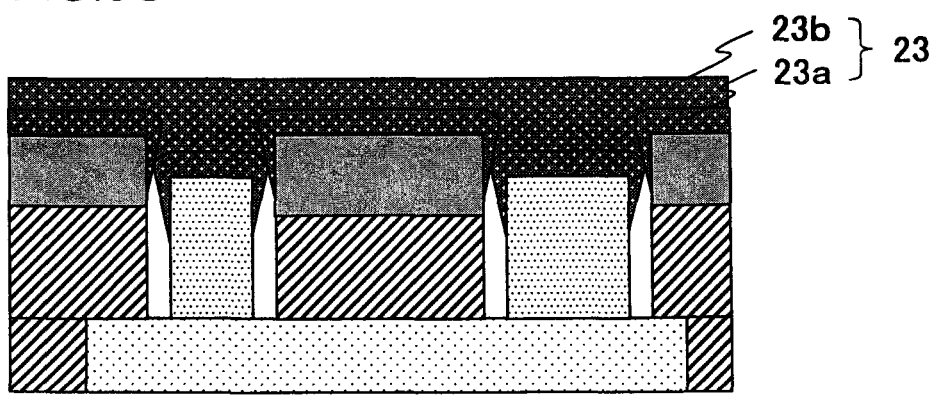

FIG. 9C shows a separate method for forming the state of FIG. 9A. The film formation of an insulation film 23a having poor step coverage is stopped at a stage in which the opening of the side space 22 is plugged. After that, using a silicon oxide film by the rotating application method or reflowable BPSG film, a new insulation film 23b is deposited, the recess parts are filled and the surface thereof is planarized, resulting in making the interlayer insulation film 23 as shown in FIG. 9A.

Figure 10:
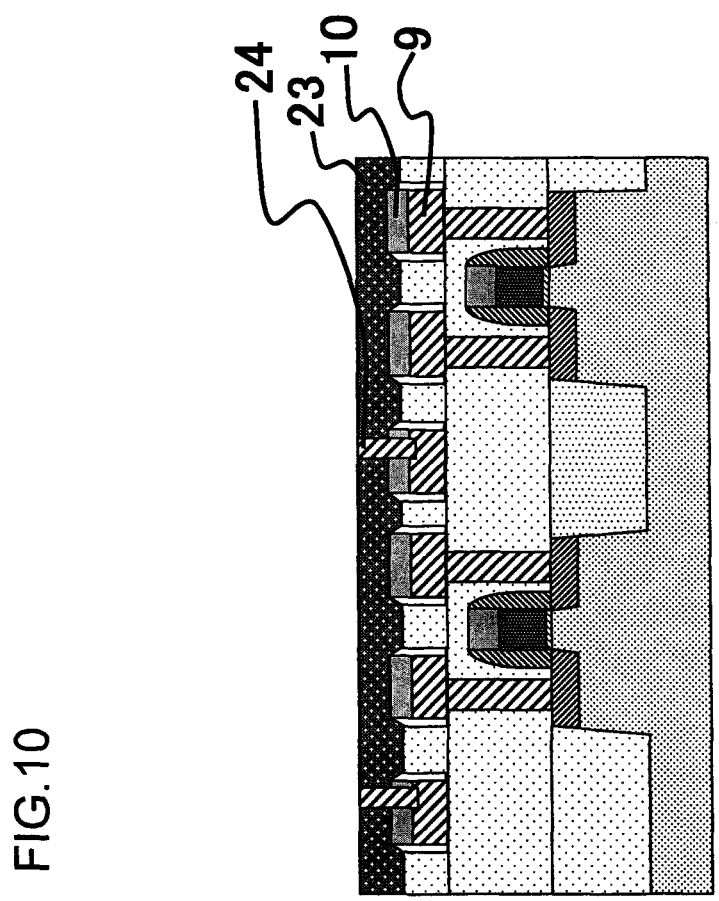

As shown in FIG. 10, an exposure and a developing are performed for a photoresist film (not shown) applied on the interlayer insulation film 23, so that an opening (hole) pattern having a desired shape is formed above the desired wirings 9. By performing the dry etching using the opening (hole) pattern, second openings (not shown) are formed in the interlayer insulation film 23 and the cap insulation films 10. A conductive film of tungsten (W) and the like is used to embed the second openings and then the CMP process is performed to remove the conductive film on the interlayer insulation film 23. Thereby, contact plugs 24 that are connected to the first wirings 9 are formed.

Figure 11:
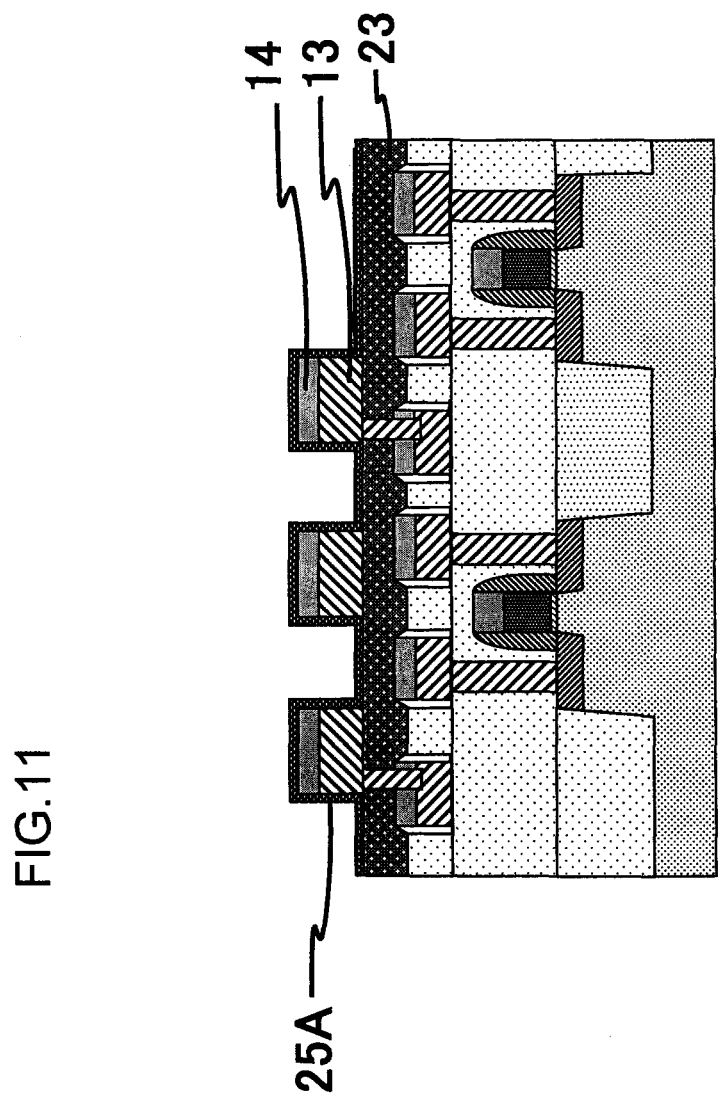

As shown in FIG. 11, a tungsten (W) film having a thickness of about 300 nm by the sputtering method and a cap insulation film made of silicon nitride (SiN) having a thickness of about 150 nm by the PE-CVD method are sequentially formed on an entire surface of the interlayer insulation film 23. Then, when the films are separated (patterned) by the photolithography and dry etching method, the second wirings 13 including the cap insulation films 14 on the upper surfaces thereof are formed. Since the anisotropic dry etching is used as the dry etching, the side surfaces of the cap insulation films 14 and the side surfaces of the second wirings 13 configure the same plane.

Further, a cover film 25A made of carbon (C) is formed on the entire surface of the resulting structure so that the second wirings are not embedded therebetween. The cover film 25A is formed by the LP-CVD method under the same conditions using only the thermal reaction as FIG. 2 so as to obtain a favorable step coverage.

Figure 12:
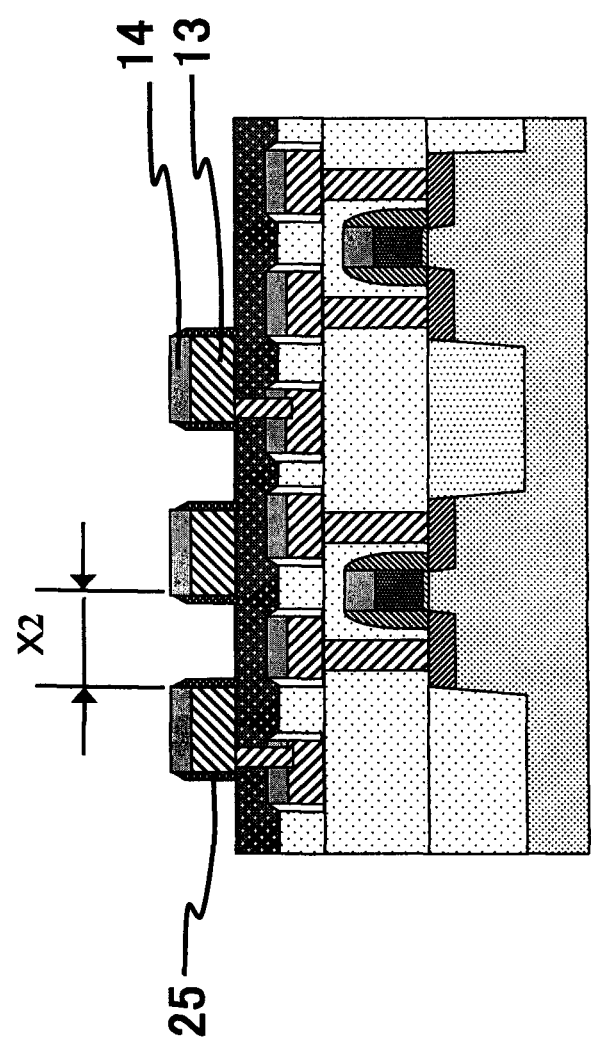

As shown in FIG. 12, when the cover film 25A is etched back by the anisotropic dry etching, the cover films 25A remain on the side surfaces of the second wirings 9 and the cap insulation films 14, so that second sidewall films 25 made of the carbon film are formed. Since the second sidewall films 25 are formed by the etch back, it is possible to form the second sidewall films on the side surfaces of all wirings. Here, an interval X2 between the second wirings 13 is about 100 nm. As described above, since the cover film 25A is formed in order to have a thickness of about 15 nm, the remaining interval between the second wirings 13 is about 70 nm. In addition, since the second wiring 13 has a thickness of about 300 nm and the cap insulation film 14 has a thickness of about 150 nm, recess parts formed between the second wirings have an aspect ratio of 450/70, i.e., a high aspect ratio of about 6.4.

Figure 13:
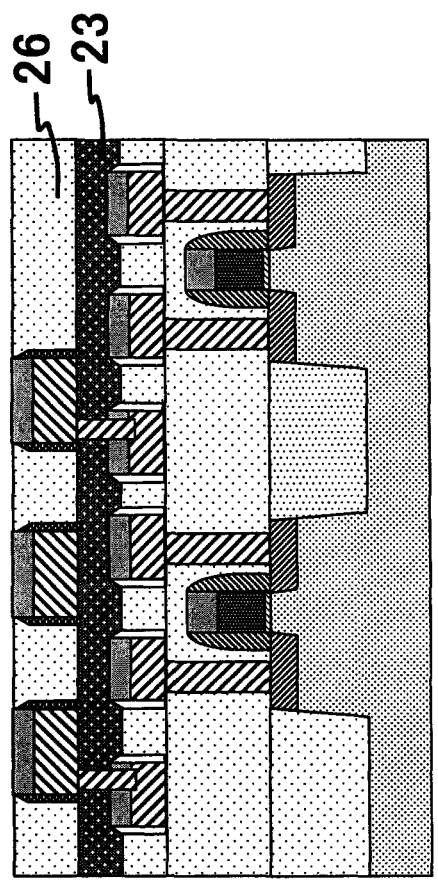

As shown in FIG. 13, the interlayer insulation film 26 (which corresponds to a first insulation film) made of silicon oxide is formed by the ALD method under the same conditions as FIG. 4, thereby embedding the second wirings 13. At this time, since the ALD method has the favorable embedding characteristic, it is possible to embed the wirings so that a void is not caused between the neighboring second wirings. Then, the interlayer insulation film 26 formed above the cap insulation film 14, is removed by the CMP in which the cap insulation films 14 is used as a stopper. Thereby, the recess parts formed between the second wirings are embedded by the silicon oxide film.

Figure 14:
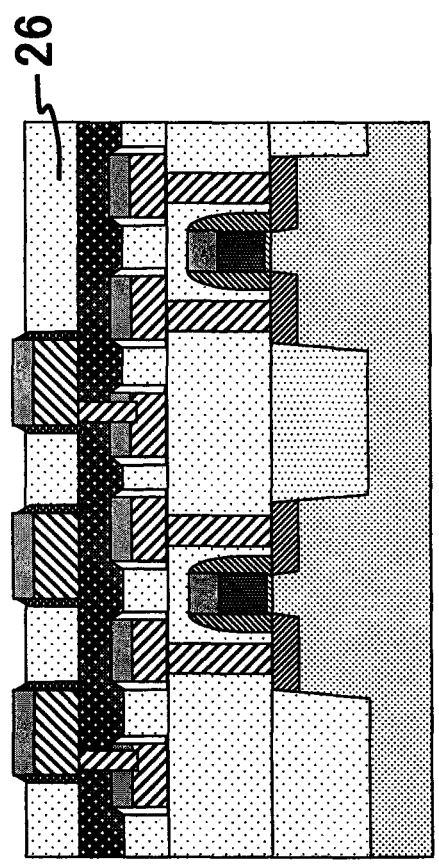

As shown in FIG. 14, the interlayer insulation film 26 on the side surfaces of the neighboring cap insulation film 14 is removed by the etch back until upper end portions of the second sidewall films 25 are exposed. At this time, due to the same reason as the wirings, the etch back is preferably performed in such a way that the upper surface of the interlayer insulation film 26 after the etch back remains at a position higher than the upper surfaces of the second wirings 13. To this end, it is preferable that the film thickness of the cap insulation films 14 is not less than two times and not more than twenty times of the film thickness of the cover films 25A.

As shown in FIG. 15, when the second sidewall films 25 are removed by the dry etching under conditions shown in FIG. 6, to form side spaces 27 between the second wirings 13 and the interlayer insulation film 26. It is preferable to form the side spaces 27 having narrow openings between the second wirings 13 and the interlayer insulation film 26. By forming the side spaces 27 having narrow openings, it is possible to prevent the gas for film formation from entering the inside of the side spaces 27 and thus the insides of the side spaces 27 from being completely embedded by the interlayer insulation film in a subsequent step for forming the interlayer insulation film.

FIG. 16 is a plan view corresponding to the step shown in FIG. 15. As shown in the plan view of FIG. 16, the side spaces 27 are formed on the side surfaces of all the second wirings under the cap insulation films 14. In other words, it is possible to stably form the side spaces on the side surfaces of all the wirings without changing the forming situations of the side spaces 27 depending on the interval of the neighboring second wirings 13.

Figure 17:
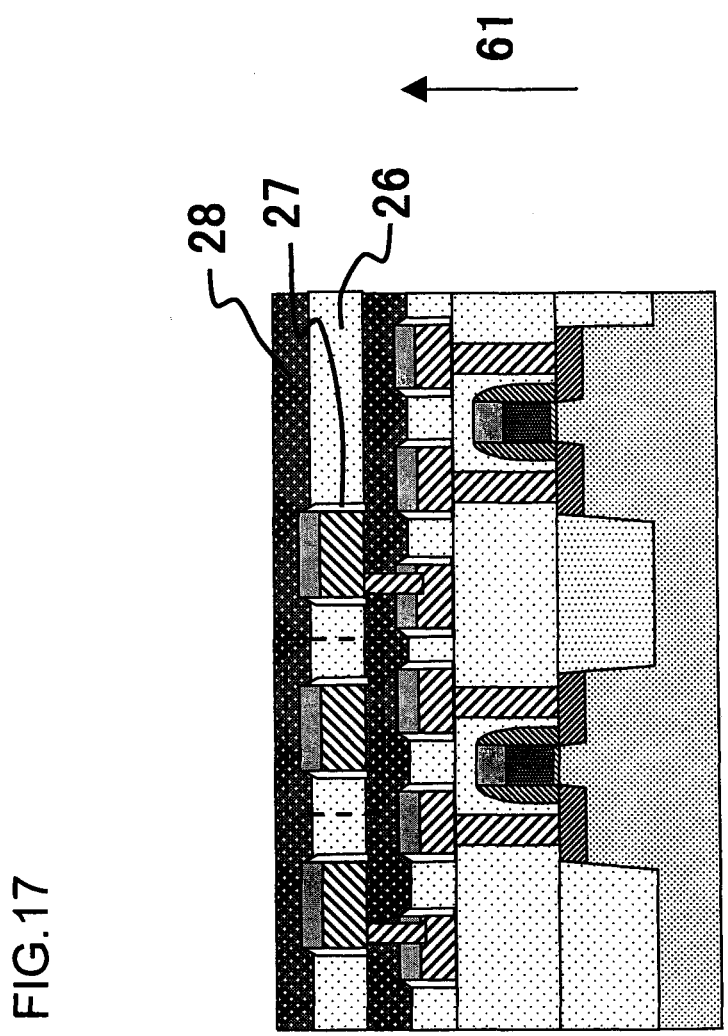

As shown in FIG. 17, the interlayer insulation film 28 (which corresponds to a second insulation film) made of silicon oxide is formed by the PE-CVD (Plasma Enhanced CVD) method under the same conditions having poor step coverage as FIG. 8. Thereby, it is possible to embed the second wirings 13 with the side spaces 27 being remained, so that it is possible to form the air gap parts 27 of the side spaces. At this time, like the first wirings 9, in the first direction 61 from the first insulation film toward the second insulation film, the positions are higher in order of the upper surfaces of the second wirings 13, the upper surface of the interlayer insulation film 26, the upper surfaces of the cap insulation films 14 and the upper surface of the interlayer insulation film 28.

Figure 18:
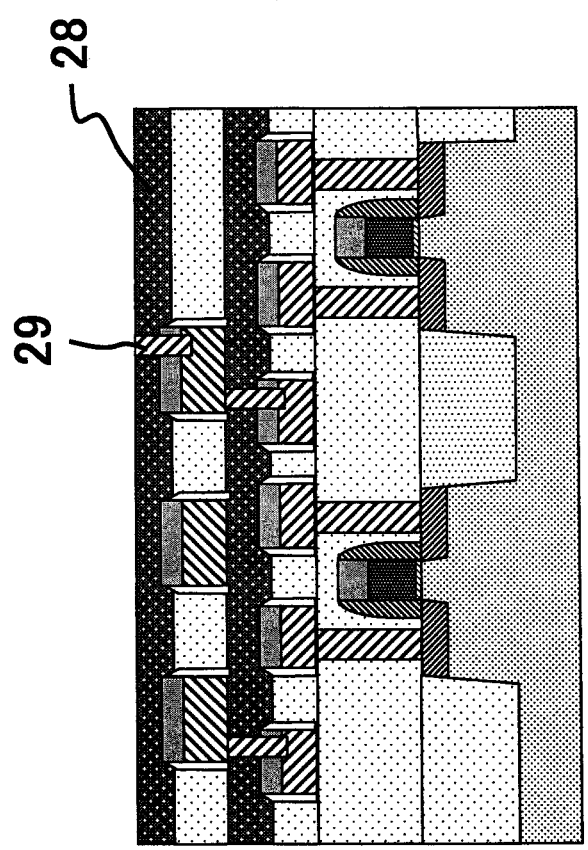

As shown in FIG. 18, an exposure and a developing are performed for a photoresist film (not shown) applied on the interlayer insulation film 28, to form an opening (hole) pattern having a desired shape above the desired second wirings 13. By performing the dry etching using the opening (hole) pattern, second openings (not shown) are formed in the interlayer insulation film 28 and the cap insulation films 14. A conductive film of tungsten (W) and the like is used to embed the second openings and then the CMP process is performed to remove the conductive film on the interlayer insulation film 28. Thereby, contact plugs 29 that are connected to the second wirings 13 are formed.

Figure 19:
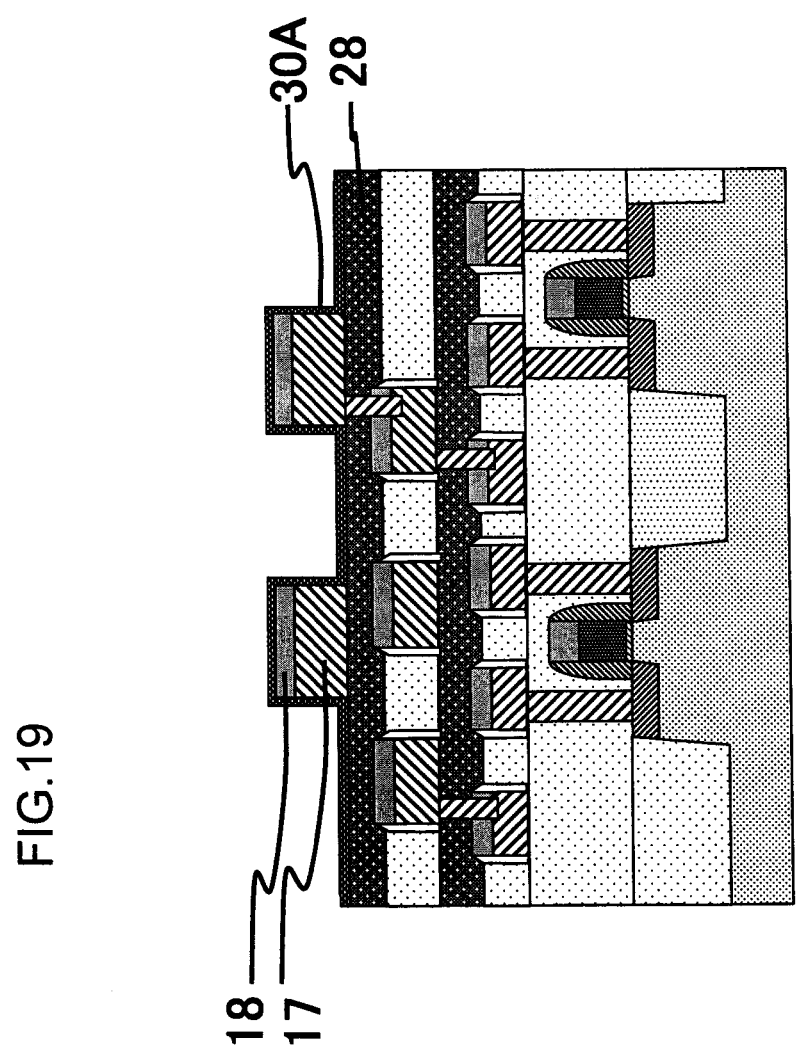

As shown in FIG. 19, an aluminum (Al) film having a thickness of about 300 nm by the sputtering method and a cap insulation film made of silicon nitride (SiN) having a thickness of about 150 nm by the PE-CVD method are sequentially formed on an entire surface of the interlayer insulation film 28. Then, the films are separated (patterned) by the photolithography and dry etching method, resulting in forming the third wirings 17 including the cap insulation films 18 on the upper surfaces thereof are formed. The side surfaces of the cap insulation films 18 and the side surfaces of the third wirings 17 configure the same plane. Further, a cover film 30A made of carbon (C) is formed on the entire surface of the resulting structure so that the third wirings are not embedded therebetween. The cover film 30A is formed by the LP-CVE method under the same conditions using only the thermal reaction as FIG. 2 so as to obtain a favorable step coverage.

Figure 20:
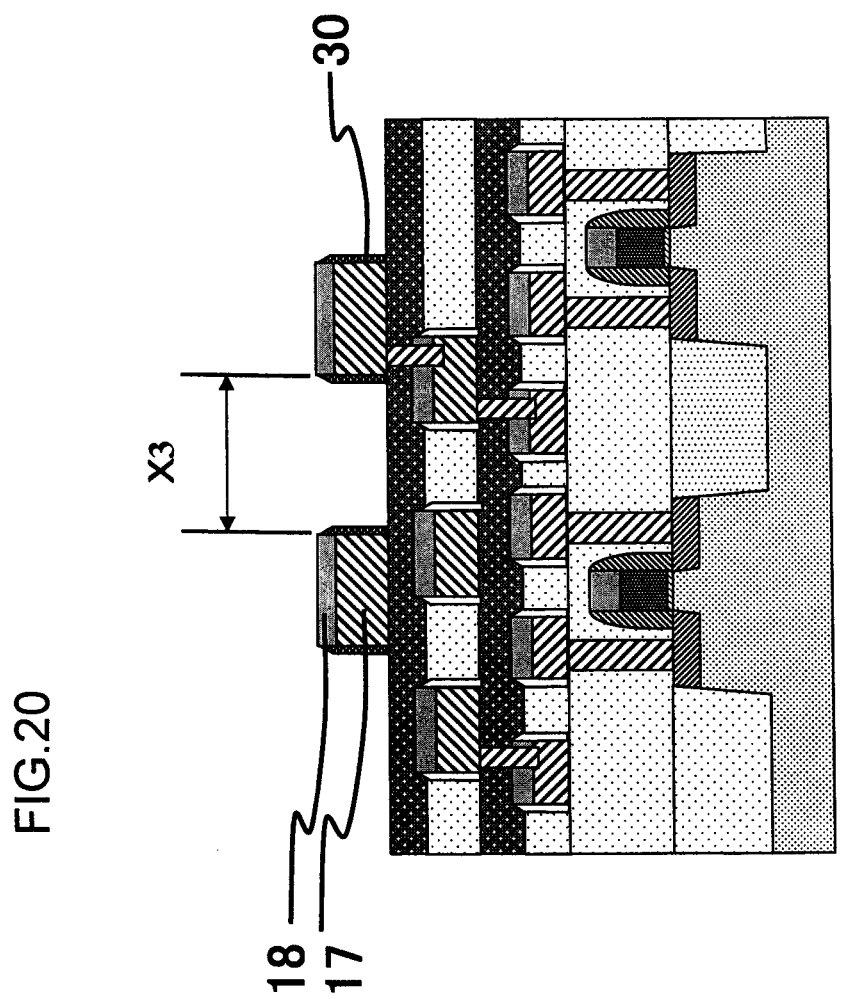

As shown in FIG. 20, the cover film 30A is etched back by the anisotropic dry etching so that the cover film 30A remains on the side surfaces of the third wirings 17 and the cap insulation films 18, resulting in forming the second sidewall films 30 made of the carbon film. Since the second sidewall films 30 are formed by the etch back, it is possible to form the second sidewall films on the side surfaces of all wirings. Here, an interval X3 between the third wirings 17 is about 2000 nm. As described above, since the cover film 30A is formed in order to have a thickness of about 15 nm, the remaining interval between the third wirings 17 is about 1970 nm. In addition, since the third wirings 17 have a thickness of about 300 nm and the cap insulation films 18 have a thickness of about 150 nm, recess parts formed between the third wirings have an aspect ratio of 450/1970, i.e., a low aspect ratio of about 0.23.

Figure 21:
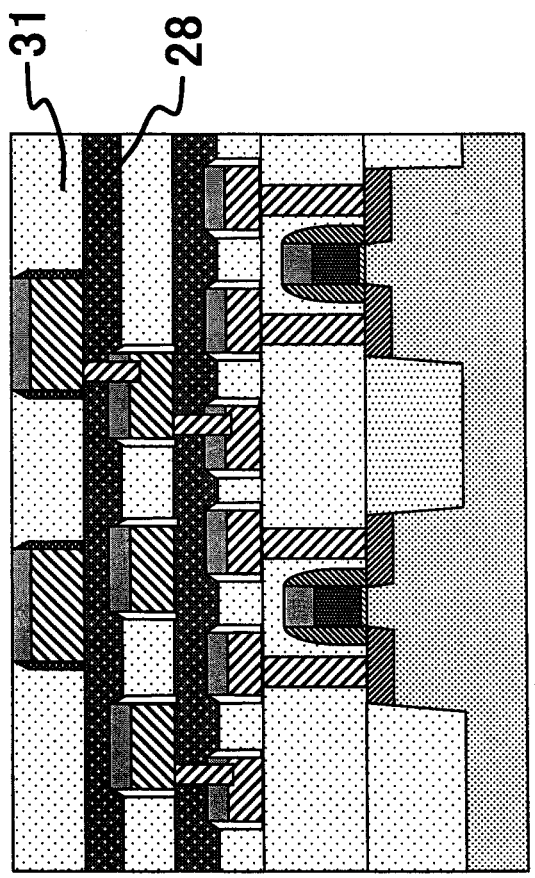

As shown in FIG. 21, the interlayer insulation film 31 (which corresponds to a first insulation film) made of silicon oxide is formed by the ALD (Atomic Layer Deposition) method under the same conditions as FIG. 4, thereby embedding the third wirings 17. At this time, since the ALD method has the favorable embedding characteristic, it is possible to embed the wirings so that a void is not caused between the neighboring third wirings. Then, the interlayer insulation film 31 formed above the cap insulation films 18, is removed by the CMP in which the cap insulation films 18 are used as a stopper. Thereby, the recess parts formed between the third wirings are embedded by the silicon oxide film.

Figure 22:
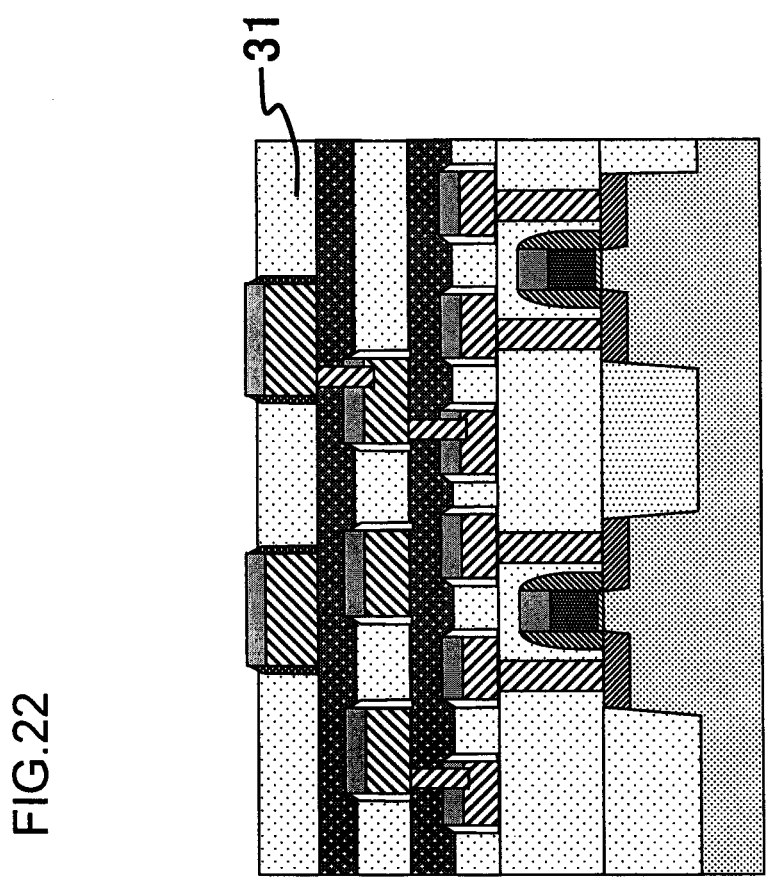

As shown in FIG. 22, the interlayer insulation film 31 between the side surfaces of the neighboring cap insulation film 18 is removed by the etch back until upper end portions of the sidewall films 30 are exposed. At this time, due to the same reason as the first wirings, the etch back is preferably performed in such a way that the upper surface of the interlayer insulation film 31 after the etch back remains at a position higher than the upper surfaces of the third wirings 17. To this end, it is preferable that the film thickness of the cap insulation film 18 is not less than two times and not more than twenty times of the film thickness of the cover film 30A.

As shown in FIG. 23, the second sidewall films 30 are removed by the dry etching under conditions shown in FIG. 6, to form side spaces 32 between the third wirings 17 and the interlayer insulation film 31. By forming the side spaces 27 having narrow openings between the third wirings 17 and the interlayer insulation film 31, it is possible to prevent the insides of the side spaces 32 from being completely embedded by the interlayer insulation film in a subsequent process of forming an interlayer insulation film.

FIG. 24 is a plan view corresponding to the step shown in FIG. 23. As shown in the plan view of FIG. 24, the side spaces 32 are formed on the side surfaces of all the third wirings 17 under the cap insulation films 18. In other words, it is possible to stably form the side spaces on the side surfaces of all the wirings without changing the forming situations of the side spaces 32 depending on the interval of the neighboring third wirings 17.

Figure 25:
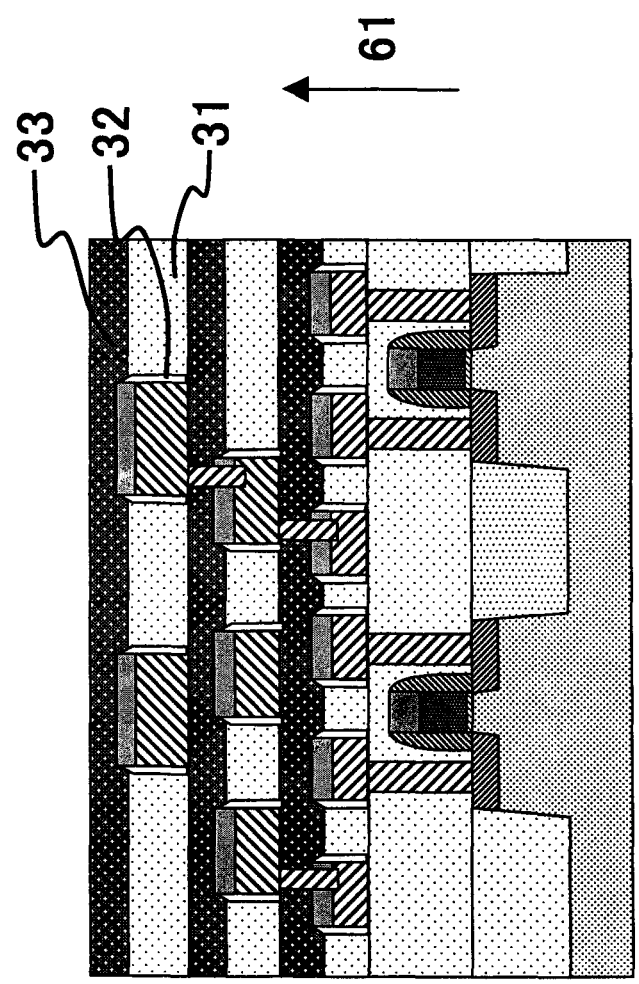
Figure 26:
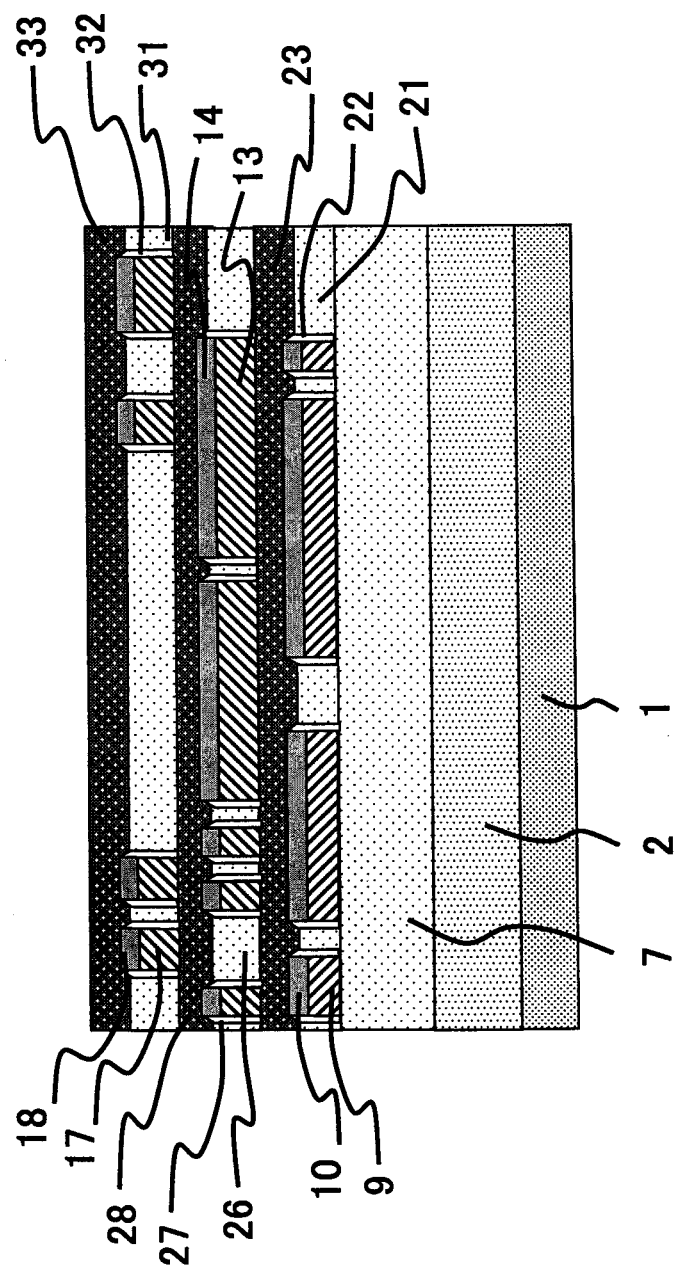

As shown in FIG. 25, the interlayer insulation film 33 (which corresponds to a second insulation film) made of silicon oxide is formed by the PE-CVD (Plasma Enhanced CVD) method under the same conditions having poor step coverage as FIG. 8. Thereby, it is possible to embed the third wirings 17 with the side spaces 32 being remained, so that it is possible to form the air gap parts 32 of the side spaces. In addition, in the first direction 61 from the first insulation film toward the second insulation film, the positions are higher in order of the upper surfaces of the third wirings 17, the upper surface of the interlayer insulation film 31, the upper surfaces of the cap insulation films 18 and the upper surface of the interlayer insulation film 33.

By the above processes, it is possible to provide a semiconductor device including the first to third wirings and including the air gap parts formed on the side surfaces of the respective wirings. FIG. 26 is a sectional view taken along a line B-B' of FIG. 24. As shown in FIG. 26, the air gap parts are formed on the side surfaces of all of the first to third wirings and the neighboring wirings are isolated from the interlayer insulation film by the side spaces.

As described above, according to this exemplary embodiment, it is possible to form the air gap parts on the side surfaces of the wirings regardless of the wiring size and pitch. As a result, it is possible to stably reduce the parasitic capacitance between the wirings.

Second Exemplary Embodiment

This exemplary embodiment relates to a semiconductor device including a memory device. In the followings, this exemplary embodiment will be described with reference to FIG. 27.

Figure 27:
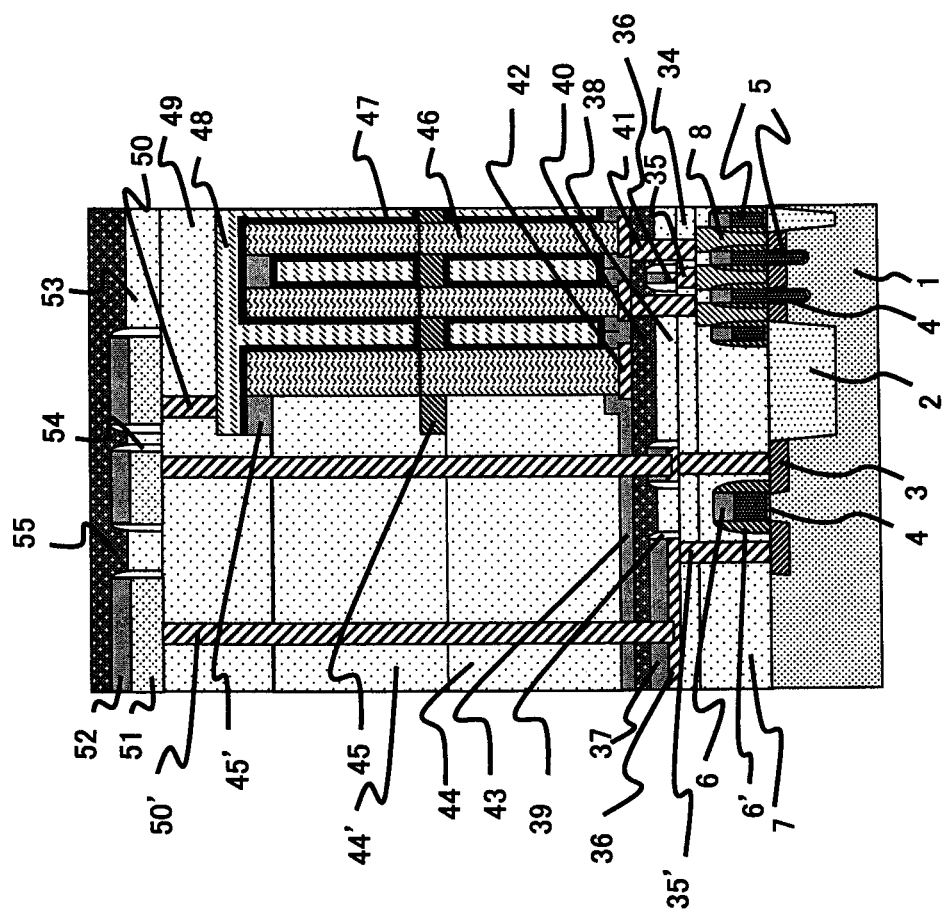
FIG. 27 illustrates a semiconductor device according to a second exemplary embodiment of the invention.

As shown in FIG. 27, the semiconductor substrate 1 includes the isolation region 2 made of an insulation film such as silicon oxide ($SiO_2$) and the like and the diffusion regions 3 into which phosphorous (P) and the like diffuses. On the semiconductor substrate 1, the gate insulation films 4, the gate electrodes 5 and the cap insulation films 6 are deposited and side surfaces thereof are covered with the sidewall films 6'. The semiconductor substrate 1, the diffusion regions 3, the gate insulation films 4, the gate electrodes 5, the cap insulation films 6 and the sidewall films 6' configure transistors. One transistor shown in the left of FIG. 27 corresponds to a first transistor and two transistors shown in the right correspond to a second transistor.

In the interlayer insulation film 7 in which the transistors are embedded, the contact plugs 8 are formed and connected to the diffusion regions 3. The contact plugs 35 formed in the interlayer insulation film 34 connect bit lines 36 and the contact plugs 8. Likewise, the contact plugs 35' connect the bit lines 36 and the diffusion regions 3.

Cap insulation films 37 is deposited on the bit lines 36 and air gap parts 39 are formed between side surfaces of the bit lines 36 and the interlayer insulation films 38, 40.

A layout of the bit lines 36 is restrained by a layout of the transistors. Due to this, according to the conventional method of forming air gap parts between the wirings, it is difficult to enable an interval between the bit lines to have a size capable of stably forming a void. However, according to this exemplary embodiment, by forming the side spaces on the side surfaces of the respective bit lines, instead of the voids, it is possible to separate the bit lines 36 regardless of the layouts. As a result, it is possible to stably reduce the parasitic capacitance between the bit lines.

Capacitive contacts 42 are formed on the interlayer insulation film 40 and are connected to the contact plugs 8 with the contact plugs 41 interposed the capacitive contacts 42 and the contact plugs 8. Further, a stopper film 43 and interlayer insulation films 44, 44' are deposited in order to cover the interlayer insulation film 40. In the respective interlayer insulation films, lower electrodes 46, a capacitive insulation film 47 and an upper electrode 48 are formed. In addition, support films 45, 45' are connected to the lower electrodes 46 so that the lower electrodes 46 do not collapse.

A contact plug 50, which is formed in the interlayer insulation film 49 having the upper electrode embedded therein, is connected to a wiring 51 and the upper electrode 48. Likewise, a contact plug 50' is connected to the wiring 51 and the bit line 36. Cap insulation films 52 is deposited on the wirings 51, and air gap parts 54 are formed between side surfaces of the wirings 51 and the interlayer insulation films 53, 55.

A layout of the wirings 51 is restrained by the layout of the bit lines 36 or lower electrodes 46. Due to this, according to the conventional method of forming air gap parts between the wirings, it is difficult to enable an interval between the wirings to have a size capable of stably forming a void. However, according to this exemplary embodiment, it is possible to form the side spaces on the side surfaces of the respective the wirings, instead of the voids. As a result, since it is possible to separate the wirings 51 regardless of the layouts of the wirings, it is possible to stably reduce the parasitic capacitance between the wirings.

Third Exemplary Embodiment

This exemplary embodiment is a modified embodiment of the first exemplary embodiment and is different from the first exemplary embodiment, in that it includes first sidewall films contacting with the side surfaces of the wirings and air gap parts between the first sidewall films and the interlayer insulation film.

In the followings, a method of manufacturing a semiconductor device according to this exemplary embodiment will be described with reference to FIGS. 28 to 35. In the meantime, FIGS. 28 to 35 are sectional views corresponding to FIGS. 1 to 6, 8, 10 to 15, 17 to 23 and 25 of the first exemplary embodiment.

Figure 28:
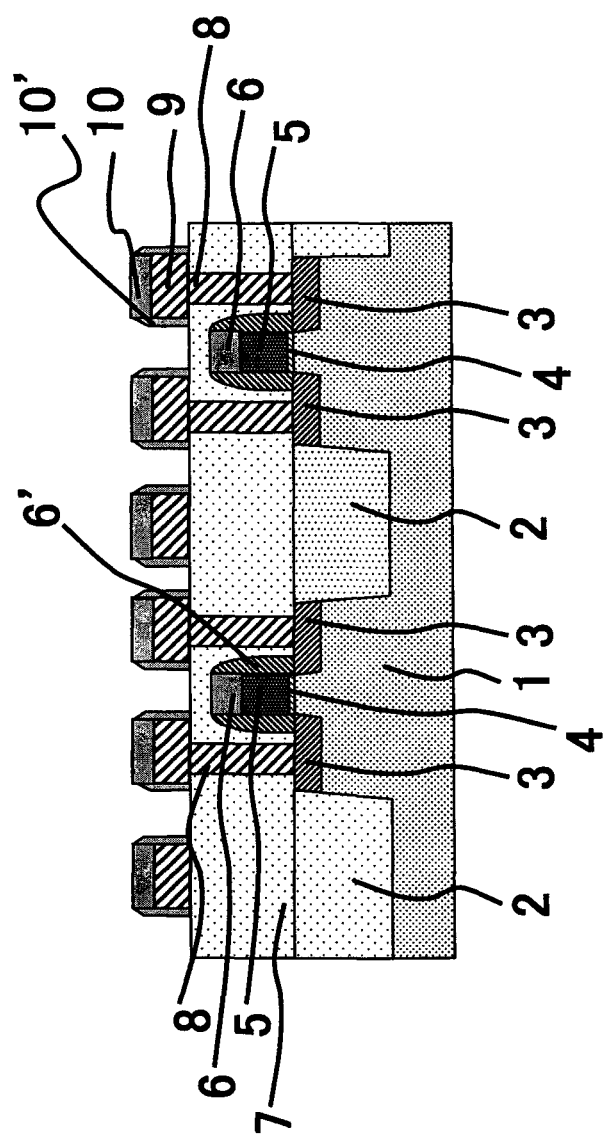
FIGS. 28 to 35 illustrate a method of manufacturing the semiconductor device according to a third exemplary embodiment of the invention.

As shown in FIG. 28, the isolation region 2 made of an insulation film and the diffusion regions 3 by the ion implantation are formed in the semiconductor substrate 1. The gate insulation films 4 by the thermal oxidation, the gate electrodes 6 made of a conductive film, and the cap insulation films 6 made of silicon nitride (SiN) and the like are formed and a pattern of transistors is formed by the dry etching. Further, an insulation film made of silicon nitride (SiN) and the like is formed and etched back. Thereby, the sidewall films 6' cover the side surfaces of the transistor pattern, so that transistors surrounded by the cap insulation films 6 and the sidewall films 6' are completed.

Then, the interlayer insulation film 7 made of SOD (Spin On Dielectrics) and the like is formed in order to embed the transistors and a surface of the interlayer insulation film 7 is planarized by the CMP. A photoresist film (not shown) applied on the interlayer insulation film 7 is exposed and developed, so that an opening (hole) pattern having a desired shape is formed above the desired diffusion regions 3. Then, first openings (not shown) are formed in the interlayer insulation film 7 by the dry etching. A conductive film made of tungsten (W) and the like is used to embed the insides of the first openings and then the CMP process is performed to remove the conductive film on the interlayer insulation film 7, to form the contact plugs 8. Here, the contact plugs 8 are connected to the diffusion regions 3.

Subsequently, a tungsten (W) film having a thickness of about 50 nm by the sputtering method and the cap insulation film 10 made of silicon nitride (SiN) having a thickness of about 100 nm by the PE-CVD method are sequentially formed on an entire surface of the interlayer insulation film 7. Then, the films are separated (patterned) by the photolithography and dry etching method, to form the first wirings 9 including the cap insulation films 10 on the upper surfaces thereof. Since the anisotropic dry etching is used as the dry etching, the side surfaces of the cap insulation films 10 and the side surfaces of the first wirings 9 configure the same plane.

Then, a film of silicon nitride (SiN) and the like is formed by the PE-CVD method and is then etched back. Thereby, the silicon nitride remains on the side surfaces of the first wirings 9 and the cap insulation films 10, to form first sidewall films 10'.

Figure 29:
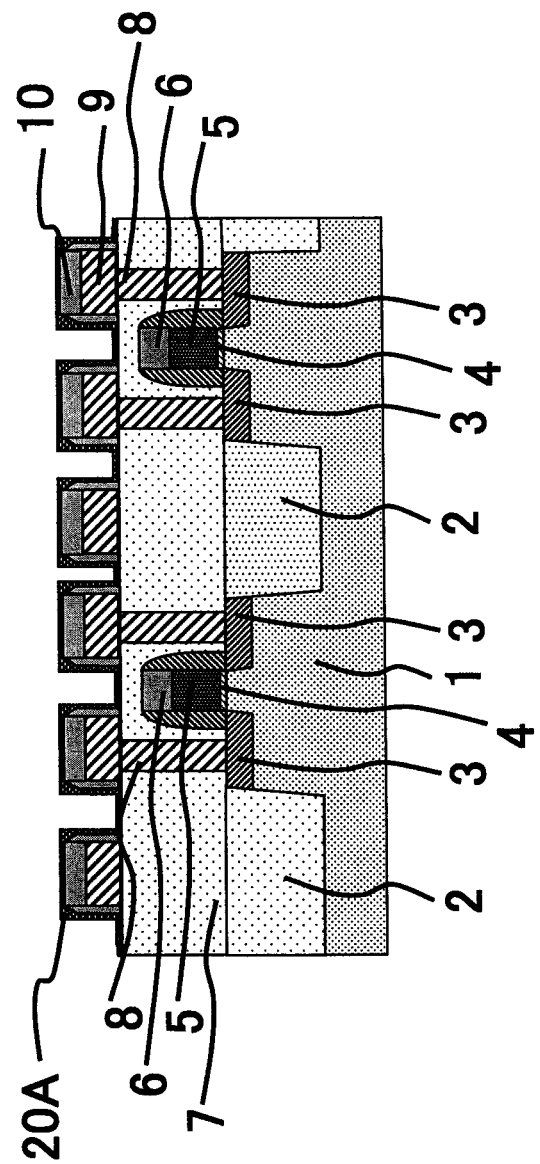

Next, as shown in FIG. 29, the cover film 20A made of carbon (C) is formed on the entire surface of the resulting structure so that the wirings are not embedded therebetween. The cover film 20A is formed by the LP-CVE method under the same conditions as FIG. 2 using only the thermal reaction so as to obtain a favorable step coverage.

Figure 30:
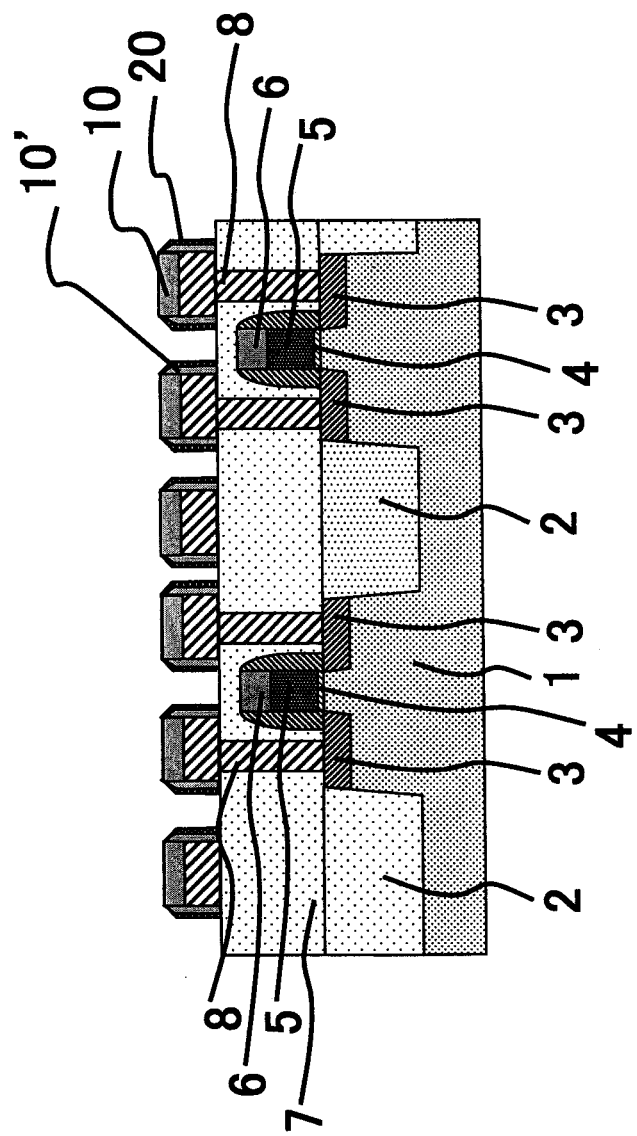

Then, as shown in FIG. 30, the cover film 20A is etched back by the anisotropic dry etching, thereby, the cover film 20A remains on the side surfaces of the first sidewall films 10' and the cap insulation films 10, resulting in forming the second sidewall films 20 made of the carbon film. Since the second sidewall films 20 are formed by the etch back, it is possible to form the second sidewall films on the side surfaces of all wirings.

Figure 31:
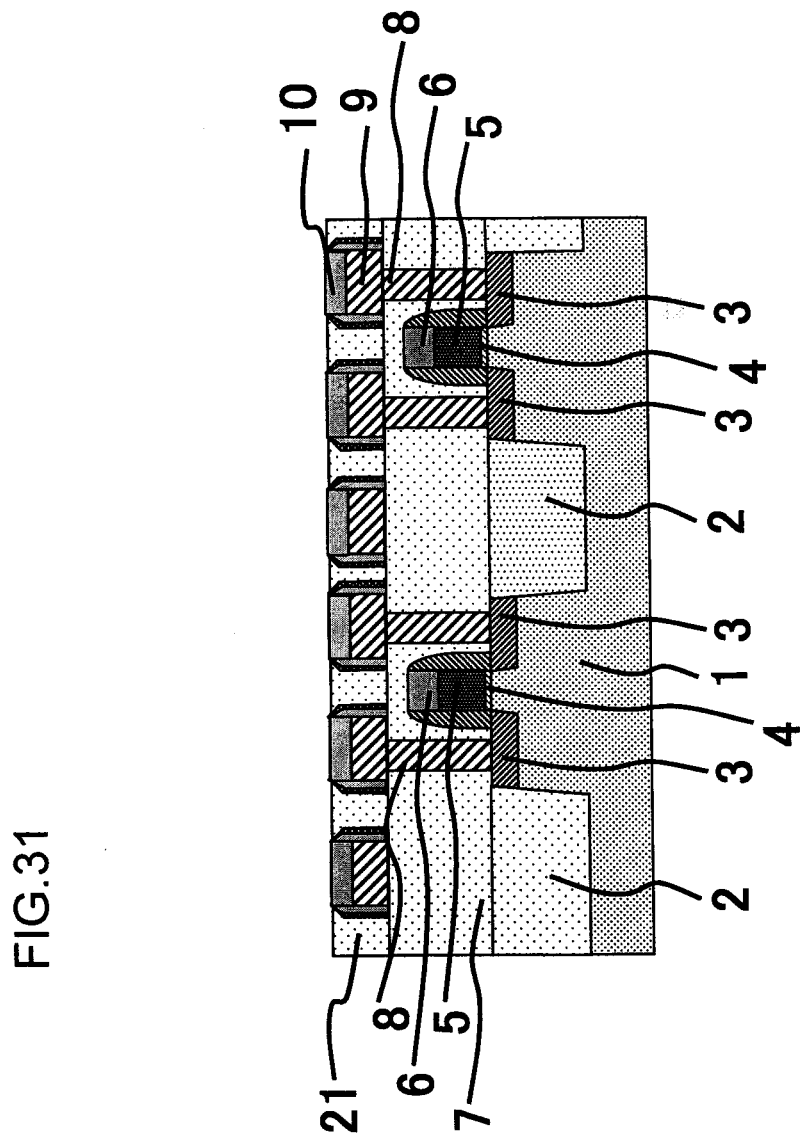

Then, as shown in FIG. 31, the interlayer insulation film 21 made of silicon oxide is formed by the ALD (Atomic layer Deposition) method under the same conditions as FIG. 4, thereby embedding the first wirings 9. At this time, since the ALD method has the favorable embedding characteristic, it is possible to embed the wirings so that a void is not caused between the neighboring wirings. Then, the interlayer insulation film 21 formed above the cap insulation films 10 is removed by the CMP in which the cap insulation films 10 are used as a stopper. Thereby, the recess parts formed between the wirings are embedded by the silicon oxide film.

Figure 32:
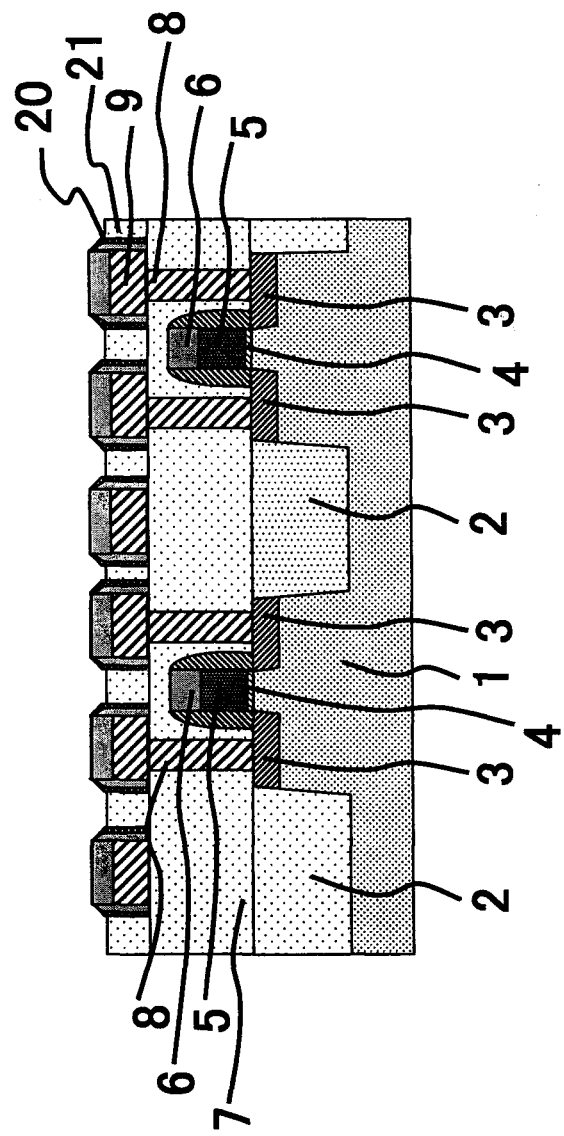

Then, as shown in FIG. 32, the interlayer insulation film 21 between the side surfaces of the neighboring cap insulation films 10 is removed by the etch back until the upper end portions of the second sidewall films 20 are exposed. At this time, the etch back is preferably performed in such a way that the upper surface of the interlayer insulation film 21 after the etch back remains at a position higher than the upper surfaces of the first wirings 9.

Figure 33:
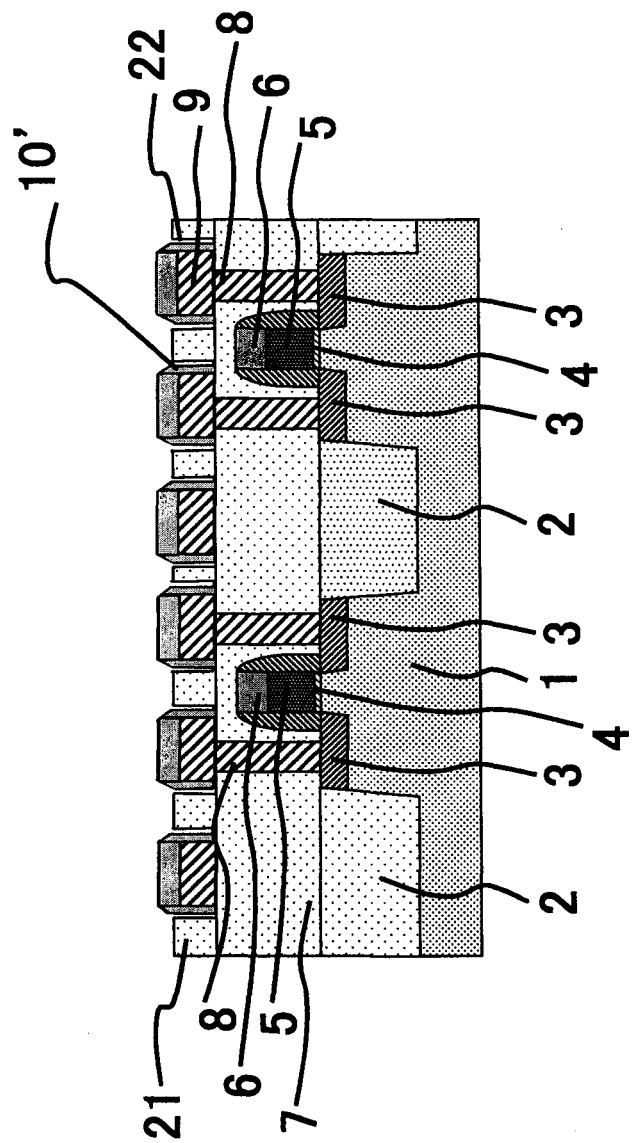

As shown in FIG. 33, the second sidewall films 20 are removed by the dry etching under the conditions shown in FIG. 6, thereby, it is possible to form the side spaces 22 between the first wirings 9 including the first sidewall films 10' and the interlayer insulation film 21. Like this, by providing the first sidewall films 10', it is possible to form the side spaces 22 with narrow openings so that the first wirings 9 and the interlayer insulation film 21 are spaced, compared to the first exemplary embodiment. In addition, since the first wirings 9 are covered with the first sidewall films 10', the first wirings are not exposed to the oxygen, which is etching gas, when removing the second sidewall films 20. As a result, it is possible to prevent the surfaces of the first wirings 9 from being oxidized, which is more favorable than the structure shown in FIG. 6.

Figure 34:
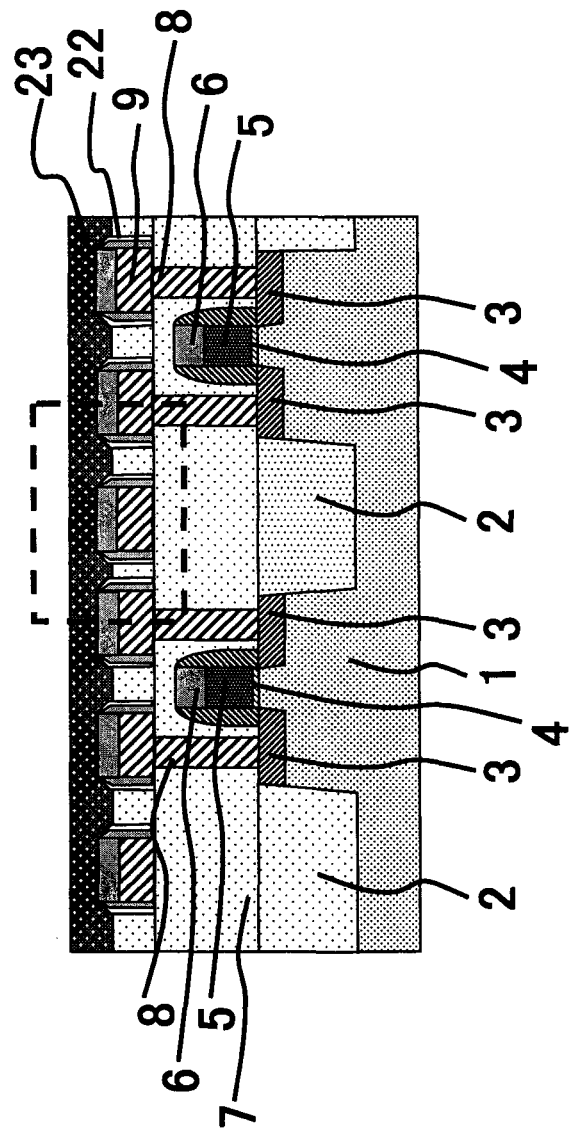

As shown in FIG. 34, the interlayer insulation film 23 made of silicon oxide is formed by the PE-CVD method under the conditions of FIG. 8. Thereby, it is possible to embed the first wirings 9 with the side spaces 22 remaining, resulting in forming the air gap parts 22 of the side spaces. The reason is as follows: since the silicon oxide film having a visor shape is formed at the openings of the side spaces 22, the gas for film formation cannot enter the inside of the side spaces 22.

Figure 35:
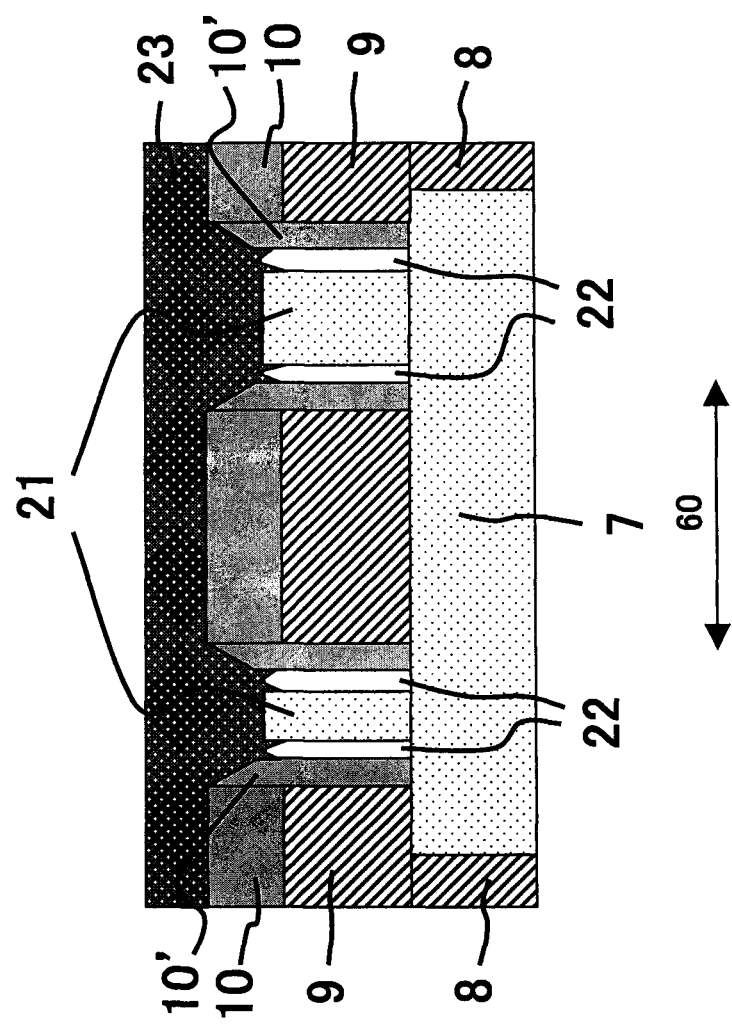
Figure 36:
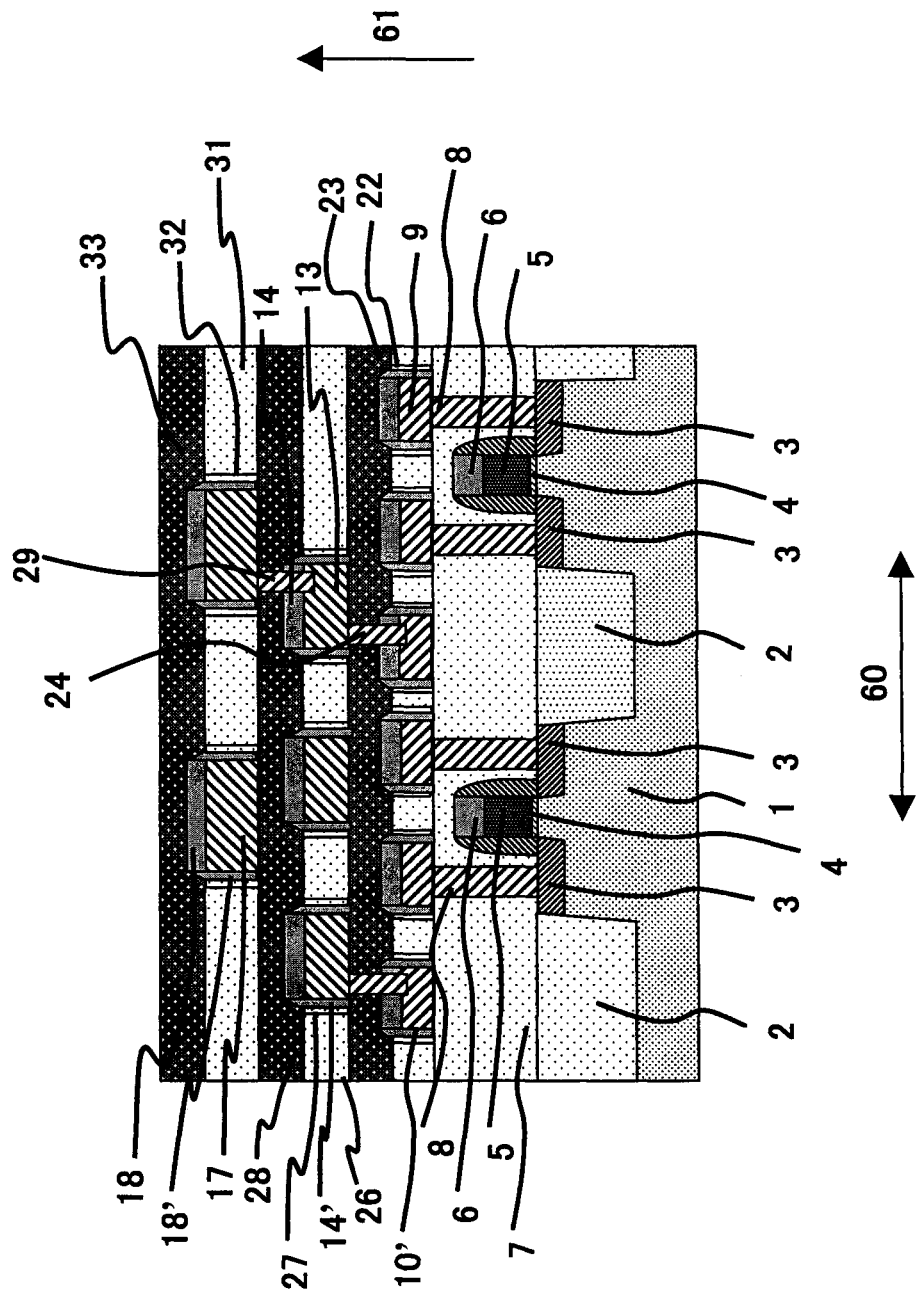
FIG. 36 illustrates a semiconductor device according to the third exemplary embodiment of the invention.

FIG. 35 is an enlarged view of a dotted part of FIG. 34. From FIG. 34, it can be seen that the air gap parts 22 are formed on all side surfaces of the first sidewall films 10'. A width of the air gap part 22 in the normal direction 60 to the side surface of the first wiring 9 is preferably about 2 to 200 nm.

Subsequently, the second wirings 13 and the third wirings 17 are formed above the first wirings 9 by the same method as FIGS. 10 to 26. Hereinafter, the method will be schematically described. The second openings are formed in the interlayer insulation film 23 and the cap insulation films 10. The second openings are embedded with a conductive film, to form the contact plugs 24 connected to the first wirings 9.

A tungsten (W) film by the sputtering method and a cap insulation film by the PE-CVD method are sequentially formed on the entire surface of the interlayer insulation film 23. Then, the films are separated (patterned) by the photolithography and dry etching method, to form the second wirings 13 including the cap insulation films 14 on the upper surfaces thereof.

Then, a film of silicon nitride (SiN) and the like is formed by the PE-CVD method and is then etched back. Thereby, the silicon nitride remains on the side surfaces of the second wirings 13 and the cap insulation films 14, thereby, the first sidewall films 14' are formed.

Next, a cover film made of carbon (C) is formed on the entire surface so that the wirings are not embedded therebetween. By etching back the cover film by the anisotropic dry etching, the cover film remains on the side surfaces of the first sidewall films 14' and the cap insulation films 14, resulting in forming second sidewall films 25 made of the carbon film. Since the second sidewall films are formed by the etch back, it is possible to form the second sidewall films on the side surfaces of all wirings.

The interlayer insulation film 26 is formed by the ALD method, thereby embedding the second wirings 13. Then, the interlayer insulation film 26 formed above the cap insulation films 14, is removed by the CMP in which the cap insulation films 14 are used as a stopper. Thereby, the recess parts formed between the second wirings are embedded by the silicon oxide film.

The interlayer insulation film 26 between the side surfaces of the neighboring cap insulation films 14 is removed by the etch back until the upper end portions of the second sidewall films are exposed. The second sidewall films are removed by the dry etching, thereby, it is possible to form the side spaces 27 between the second wirings 13 and the interlayer insulation film 26.

The interlayer insulation film 28 made of silicon oxide is formed by the PE-CVD method. Thereby, it is possible to embed the second wirings 13 with the side spaces 27 remaining, so that it is possible to form the air gap parts 27 of the side spaces. Since the second wirings 13 are covered with the first sidewall films 14', the second wirings are not exposed to the oxygen, which is etching gas, when removing the second sidewall films. As a result, it is possible to prevent the surfaces of the second wirings 13 from being oxidized.

The second openings (not shown) are formed in the interlayer insulation film 28 and the cap insulation films 14. The second openings are embedded with a conductive film, to form the contact plugs 29 connected to the second wirings 13.

A tungsten (W) film by the sputtering method and a cap insulation film made of silicon nitride (SiN) by the PE-CVD method are sequentially formed on the entire surface of the interlayer insulation film 28. Then, when the films are separated (patterned) by the photolithography and dry etching method, the third wirings 17 including the cap insulation film 18 on the upper surfaces thereof are formed.

Then, a film of silicon nitride (SiN) and the like is formed by the PE-CVD method and is then etched back. Thereby, the silicon nitride remains on the side surfaces of the third wirings 17 and the cap insulation film 18, so that the first sidewall films 18' are formed.

Next, a cover film made of carbon (C) is formed on the entire surface of the resulting structure so that the wirings are not embedded therebetween. By etching back the cover film by the anisotropic dry etching, the cover film remains on the side surfaces of the first sidewall films 18' and the cap insulation films 18, to form the second sidewall films made of the carbon film are formed. Since the second sidewall films are formed by the etch back, it is possible to form the second sidewall films on the side surfaces of all wirings.

The interlayer insulation film 31 made of silicon oxide is formed by the ALD method, thereby embedding the third wirings 17. At this time, since the ALD method has the favorable embedding characteristic, it is possible to embed the third wirings so that a void is not caused between the neighboring third wirings. Thereby, the recess parts formed between the third wirings are embedded with the silicon oxide film.

The interlayer insulation film 31 between the side surfaces of the neighboring cap insulation films 18 is removed by the etch back until the upper end portions of the second sidewall films are exposed. By removing the second sidewall films by the dry etching, it is possible to form the side spaces 32 between the third wirings 17 and the interlayer insulation film 31.

The interlayer insulation film 33 made of silicon oxide is formed by the PE-CVD method. Thereby, it is possible to embed the third wirings 17 with the side spaces 32 remaining, resulting in forming the air gap parts 32 of the side spaces. Since the third wirings 17 are covered with the first sidewall films 18', the third wirings are not exposed to the oxygen, which is etching gas, when removing the second sidewall films. As a result, it is possible to prevent the surfaces of the third wirings 17 from being oxidized.

In this exemplary embodiment, with the wirings being covered with the first sidewall films made of silicon nitride, the side spaces, which become the air gaps, are provided thereon. Accordingly, it is possible to prevent the wirings from being oxidized or corroded during the process, more effectively, thereby improving the reliabilities of the wirings and further semiconductor device. In addition, likewise the first to third exemplary embodiment, it is possible to reduce the parasitic capacitance of the wirings.

Fourth Exemplary Embodiment

Figure 37:
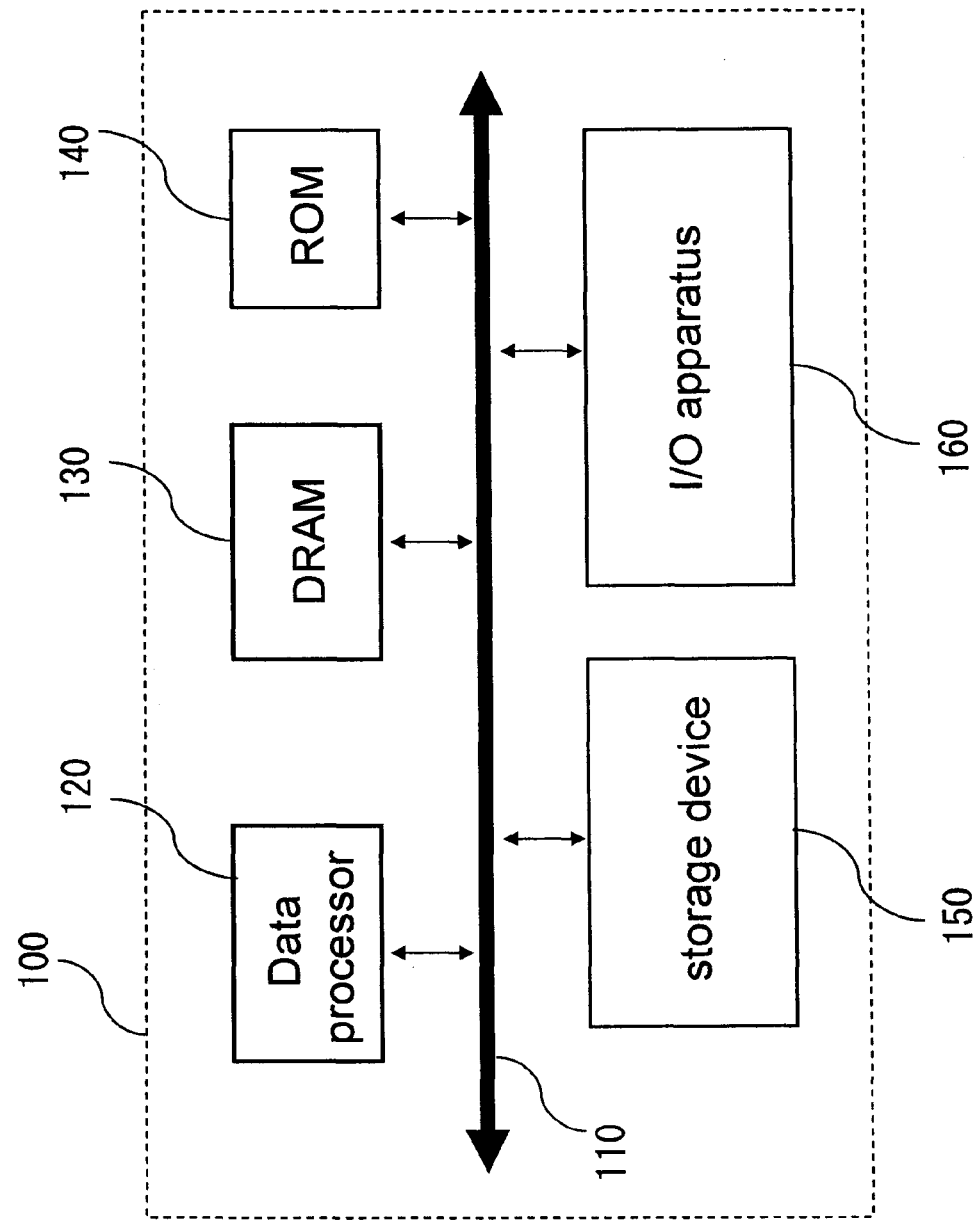
FIG. 37 illustrates a semiconductor device according to a fourth exemplary embodiment of the invention.

A semiconductor device of this exemplary embodiment will be described with reference to FIG. 37. A semiconductor device 100 includes a computer system, for example. However, the invention is not limited thereto. The semiconductor device 100 includes a data processor 120 and a DRAM 130. In the data processor 120, the three-layered wiring structure described in the first to third exemplary embodiment s may be included. In addition, the memory device and wiring structure shown in the second exemplary embodiment may be included in the DRAM 130.

The data processor 120 includes a micro processor (MPU), a digital signal processor (DPS) and the like, for example. However, the invention is not limited thereto. In FIG. 37, for simplification, the data processor 120 is connected to the DRAM 130 via a system bus 110. However, the data processor may be connected to the DRAM 130 by a local bus without through the system bus 110.

In addition, only one system bus 110 is shown for simplification. However, the system bus may be connected in series or parallel through a connector and the like, as required. In this system, a memory device 150, an I/O apparatus 160 and a ROM 140 are connected to the system bus 110, as required. However, they are not necessarily provided. The I/O apparatus 160 may include only one of an input device and an output device. In addition, although only one is shown for each of the constitutional elements for simplification, the invention is not limited thereto. For example, at least one of the constitutional elements may be provided in plural.

It is apparent that the present invention is not limited to the above embodiments, but may be modified and changed without departing from the scope and spirit of the invention.

In addition, while not specifically claimed in the claim section, the applications reserve the right to include in the claim section at any appropriate time the following method:

1. A method of manufacturing a semiconductor device, comprising:
forming a wiring on a predetermined surface;
forming a second sidewall film over the predetermined surface;
performing an etch back so that the second sidewall film remains on a side surface of the wiring;
forming a first insulation film over the predetermined surface so that a part of the second sidewall film is exposed;
removing the second sidewall film to form a side space; and
forming a second insulation film on the first insulation film so that the side space is not embedded by the second insulation film, to form an air gap part composed of the side space.

2. A method of manufacturing a semiconductor device, comprising:
forming a wiring on a predetermined surface;
sequentially forming a first sidewall film and a second sidewall film over the predetermined surface;
performing an etch back so that the first and second sidewall films remain on a side surface of the wiring;
forming a first insulation film on the predetermined surface so that a part of the second sidewall film is exposed;
removing the second sidewall film to form a side space; and
forming a second insulation film on the first insulation film so that the side space is not embedded by the second insulation film, to form an air gap part composed of the side space.

3. The method according to the above 2,
wherein the first sidewall film is a silicon nitride film.

4. The method according to the above 1,
wherein in forming the wiring, a cap insulation film is formed on the wiring, and
in performing the etch back, the second sidewall film remains on the side surfaces of the wiring and cap insulation film.

5. The method according the above 2,
wherein in forming the wiring, a cap insulation film is formed on the wiring, and
in performing the etch back, the first and second sidewall films remain on the side surfaces of the wiring and cap insulation film.

6. The method according to the above 4,
wherein in forming the first insulation film, the first insulation film is formed so that the wiring and a part of the cap insulation film are embedded in the first insulation film, and
in forming the second insulation film, the second insulation film is formed so as to cover the cap insulation film.

7. The method according to the above 4,
wherein in forming the first insulation film, the first insulation film is formed so that an upper surface of the wiring is lower than an upper surface of the first insulation film, and
in forming the second insulation film, the second insulation film is formed so that an upper surface of the second insulation film is higher than an upper surface of the cap insulation film.

8. The method according to the above 4,
wherein the second sidewall film is formed in such a way that a thickness of the cap insulation film is not less than two times and not more than twenty times of a thickness of the second sidewall film.

9. The method according to the above 1,
wherein a thickness of the second sidewall film is 2 to 200 nm.

10. The method according to the above 1, further comprising:
forming a first transistor and contact plugs connected to each of a source region and a drain region of the first transistor, before forming the wiring,
wherein in forming the wiring, the wirings are formed so that the wirings are connected to the contact plugs, the wirings being bit lines.

11. The method according to the above 1, further comprising:
forming a second transistor, before forming the wiring,
wherein in forming the wiring, the wiring is formed so that the wiring is connected to one of a source region and a drain region of the second transistor, the wiring being a bit line, and
further comprising:
forming a capacitor so that the capacitor is connected to the other of the source region and the drain region of the second transistor, after forming the second insulation film.

12. The method according to the above 1,
wherein the second sidewall film is a carbon film.

13. The method according to the above 1,
wherein a carbon film is formed by an LP-CVD method, the carbon film being the second sidewall film.

14. The method according to the above 1,
wherein in removing the second sidewall film, the second sidewall film is removed by using oxygen or ozone gas.

15. The method according to the above 5,
wherein in forming the first insulation film, the first insulation film is formed so that the wiring and a part of the cap insulation film are embedded in the first insulation film, and
in forming the second insulation film, the second insulation film is formed so as to cover the cap insulation film.

16. The method according to the above 5,
wherein in forming the first insulation film, the first insulation film is formed so that an upper surface of the wiring is lower than an upper surface of the first insulation film, and
in forming the second insulation film, the second insulation film is formed so that an upper surface of the second insulation film is higher than an upper surface of the cap insulation film.

17. The method according to the above 5,
wherein the second sidewall film is formed in such a way that a thickness of the cap insulation film is not less than two times and not more than twenty times of a thickness of the second sidewall film.

18. The method according to the above 2,
wherein a thickness of the second sidewall film is 2 to 200 nm.

19. The method according to the above 2, further comprising:
forming a first transistor and contact plugs connected to each of a source region and a drain region of the first transistor, before forming the wiring,
wherein in forming the wiring, the wirings are formed so that the wirings are connected to the contact plugs, the wirings being bit lines.

20. The method according to the above 2, further comprising:
forming a second transistor, before forming the wiring,
wherein in forming the wiring, the wiring is formed so that the wiring is connected to one of a source region and a drain region of the second transistor, the wiring being a bit line, and
further comprising:
forming a capacitor so that the capacitor is connected to the other of the source region and the drain region of the second transistor, after forming the second insulation film.

21. The method according to the above 2,
wherein the second sidewall film is a carbon film.

22. The method according to the above 2,
wherein a carbon film is formed by an LP-CVD method, the carbon film being the second sidewall film.

23. The method according to the above 2,
wherein in removing the second sidewall film, the second sidewall film is removed by using oxygen or ozone gas.

The invention claimed is:

1. A method of manufacturing a semiconductor device, comprising:
  forming a wiring on a predetermined surface;
  forming a second sidewall film over the predetermined surface;
  performing an etch back so that the second sidewall film remains on a side surface of the wiring;
  forming a first insulation film over the predetermined surface so that a part of the second sidewall film is exposed;
  removing the second sidewall film to form a side space; and
  forming a second insulation film on the first insulation film so that the side space is not embedded by the second insulation film, to form an air gap part composed of the side space; and
  forming a first sidewall film in the air gap part so that the first sidewall film contacts with the side surface of the wiring.

2. The method of manufacturing the device according to claim 1, wherein the first sidewall film is a silicon nitride film.

3. The method of manufacturing the device according to claim 1, wherein a width of the air gap part in a normal direction to the side surface of the wiring is 2 to 200 nm.

4. A semiconductor device comprising:
  a wiring structure including a conductive layer and a cap insulating film, the conductive layer including a first upper surface and a first side surface extending downwardly from the first upper surface, the cap insulating film being formed on the first upper surface of the conductive layer and including a second upper surface and a second side surface, the second side surface extending downwardly from the second upper surface and being substantially vertically aligned with the first side surface of the conductive layer;
  an interlayer insulating film formed to cover the wiring structure; and
  an air gap embedded into the interlayer insulating film adjacently to the wiring structure, the air gap being larger in height than the first upper surface of the conductive layer and smaller in height than the second upper surface of the cap insulating film.

5. The device as claimed in claim 4, wherein the air gap exposes the first side surface of the conductive layer and a part of the second side surface of the cap insulating layer.

6. The device as claimed in claim 5, wherein the cap insulating film is deferent in material from the interlayer insulating film.

7. The device as claimed in claim 6, wherein the cap insulating film comprises a silicon nitride film and the interlayer insulating film comprises a silicon oxide film.

8. The device as claimed in claim 4, wherein the wiring structure further includes a side insulating film covering the first side surface of the conductive layer and the second side surface of the cap insulating film, and the air gap exposes the side insulating film.

9. The device as claimed in claim 8, wherein the interlayer insulating is different in material from each of the side insulating film and the cap insulating film.

10. The device as claimed in claim 9, wherein each of the cap insulating film and the side insulating film comprises a silicon nitride film and the interlayer insulating film comprises a silicon oxide film.

11. The device as claimed in claim 4, wherein the air gap is embedded in the insulating film to surround a substantially entire periphery of the wiring structure.

12. The device as claimed in claim 4, wherein a width of the air gap in a normal direction to a side surface of the wiring structure is 2 to 200 nm.

13. The device as claimed in claim 4, further comprising:
  an additional wiring structure formed on the interlayer insulating film, the additional wiring structure including an additional conductive layer and an additional cap insulating film, the additional conductive layer including a third upper surface and a third side surface extending downwardly from the third upper surface, the additional cap insulating film being formed on the third upper surface of the additional conductive layer and including a fourth upper surface and a fourth side surface, the fourth side surface extending downwardly from the fourth upper surface and being substantially vertically aligned with the third side surface of the additional conductive layer;
  a contact plug formed in the interlayer insulating film in contact with the additional conductive layer of the additional wiring structure, the contact plug penetrating through the first interlayer insulating film and the cap insulating film of the wiring structure to be in contact with the conductive layer of the wiring structure;
  an additional interlayer insulating film formed to cover the additional wiring structure; and
  an additional air gap embedded into the additional interlayer insulating film adjacently to the additional wiring structure, the additional air gap being larger in height than the third upper surface of the additional conductive layer and smaller in height than the fourth upper surface of the additional cap insulating film.

14. The device as claimed in claim 13, wherein the air gap exposes the first side surface of the conductive layer and a part of the second side surface of the cap insulating layer, the additional air gap exposing the third side surface of the additional conductive layer and a part of the fourth side surface of the additional cap insulating layer, and each of the interlayer insulating film and the additional interlayer insulating film being different in material than each of the cap insulating film and the additional cap insulating film.

15. The device as claimed in claim 13, wherein the wiring structure further includes a side insulating film covering the first side surface of the conductive layer and the second side surface of the cap insulating film, the additional wiring structure further including an additional side insulating film covering the third side surface of the additional conductive layer and the fourth side surface of the additional cap insulating film, and the air gap exposing the side insulating film, the additional air gap exposing the additional side insulating film, and each of the interlayer insulating film and the additional interlayer insulating film being different in material than each of the cap insulating film, the additional cap insulating film, the side insulating film and the additional side insulating film.

16. A semiconductor device comprising:
  a first wiring structure comprising a first conductive layer including a first upper surface and a first side surface extending downwardly from the first upper surface, a first cap insulating film formed on the first upper surface of the first conductive layer and including a second upper surface and a second side surface, the second side surface extending downwardly from the second upper surface and being substantially vertically aligned with the first side surface of the first conductive layer;

a second wiring structure formed adjacently to the first wiring structure and comprising a second conductive layer including a third upper surface and a third side surface extending downwardly from the third upper surface and facing to the first side surface of the first conductive layer of the first wiring structure, a second cap insulating film formed on the third upper surface of the second conductive layer and including a fourth upper surface and a fourth side surface, the fourth side surface extending downwardly from the fourth upper surface and being substantially vertically aligned with the third side surface of the second conductive layer, the fourth side surface facing to the second side surface of the first cap insulating film;

an interlayer insulating film formed to cover the first and second wiring structures;

a first air gap embedded into the interlayer insulating film adjacently to the first wiring structure, the first air gap being larger in height than the first upper surface of the first conductive layer and smaller in height than the second upper surface of the first cap insulating film; and a second air gap embedded into the interlayer insulating film adjacently to the second wiring structure so that a part of the interlayer insulating film intervenes between the first and second air gaps, the second air gap being larger in height than the third upper surface of the second conductive layer and smaller in height than the fourth upper surface of the second cap insulating film.

17. The device as claimed in claim 16, wherein the first air gap exposes the first side surface of the first conductive layer and a part of the second side surface of the first cap insulating layer, and the second air gap exposes the third side surface of the second conductive layer and a part of the fourth side surface of the second cap insulating layer.

18. The device as claimed in claim 17, wherein each of the first and second cap insulating films is deferent in material from the interlayer insulating film.

19. The device as claimed in claim 16, wherein the first wiring structure further comprises a first side insulating film covering the first side surface of the first conductive layer and the second side surface of the first cap insulating film, and the second wiring structure further comprises a second side insulating film covering the third side surface of the second conductive layer and the fourth side surface of the second cap insulating film, the first and second air gaps exposing the first and second side insulating films, respectively.

20. The device as claimed in claim 19, wherein the interlayer insulating film is different in material than each of the first and second side insulating films and each of the first and second cap insulating films.

21. The device as claimed in claim 16, wherein the second conductive layer includes a fifth side surface opposite to the third side surface and the second cap insulating film includes a sixth side surface opposite to the fourth side surface; and the device further comprises:

a third wiring structure formed adjacently to the second wiring structure so that the second wiring structure is between the first and third wiring structures, the third wiring structure comprising a third conductive layer including a fifth upper surface and a seventh side surface extending downwardly from the fifth upper surface and facing to the fifth side surface of the second conductive layer of the second wiring structure, a third cap insulating film formed on the fifth upper surface of the third conductive layer and including a sixth upper surface and an eighth side surface, the eighth side surface extending downwardly from the sixth upper surface and being substantially vertically aligned with the seventh side surface of the third conductive layer, the eighth side surface facing to the sixth side surface of the second cap insulating film;

a third air gap embedded into the interlayer insulating film adjacently to the second wiring structure so that the second wiring structure is between the second and third air gaps, the third air gap being larger in height than the third upper surface of the second conductive layer and smaller in height than the fourth upper surface of the second cap insulating film; and a fourth air gap embedded into the interlayer insulating film adjacently to the third wiring structure so that another part of the interlayer insulating film intervenes between the third and fourth air gaps, the fourth air gap being larger in height than the fifth upper surface of the third conductive layer and smaller in height than the sixth upper surface of the third cap insulating film;

wherein a distance between the first and second wiring structures is greater than a distance of between the second and third wiring structures; and each of the first, second, third and fourth air gaps is substantially equal in width to one another so that the part of the interlayer insulating film intervening between the first and second wiring structures is greater in width than the another part of interlayer insulating film intervening between the second and third wiring structures.

* * * * *